US012671380B2

(12) United States Patent
Ganta et al.

(10) Patent No.: US 12,671,380 B2
(45) Date of Patent: Jun. 30, 2026

(54) HIGH INPUT IMPEDANCE SWITCHED-CAPACITOR AMPLIFIER

(71) Applicant: Apple Inc., Cupertino, CA (US)

(72) Inventors: Saikrishna Ganta, San Jose, CA (US); Sudharsan Kanagaraj, San Jose, CA (US); Siladitya Dey, Redwood City, CA (US); Man-Chia Chen, Milpitas, CA (US); Paritosh Bhoraskar, Sunnyvale, CA (US); Srinivas Bangalore Seshadri, Mountain View, CA (US); Tao Wang, Cupertino, CA (US); Si Chen, Fremont, CA (US)

(73) Assignee: Apple Inc., Cupertino, CA (US)

( * ) Notice: Subject to any disclaimer, the term of this patent is extended or adjusted under 35 U.S.C. 154(b) by 572 days.

(21) Appl. No.: 18/302,414

(22) Filed: Apr. 18, 2023

(65) Prior Publication Data

US 2024/0356507 A1      Oct. 24, 2024

(51) Int. Cl.
  *H03F 1/02*      (2006.01)
  *H03F 3/45*      (2006.01)
(52) U.S. Cl.
  CPC ... *H03F 3/45475* (2013.01); *H03F 2200/165* (2013.01); *H03F 2200/171* (2013.01)
(58) Field of Classification Search
  CPC .......... H03F 3/45475; H03F 2200/165; H03F 2200/171; H03F 2203/45138; H03F 3/005; H03F 3/45928; H03F 3/45968; H03F 2203/45514; H03F 2203/45551; H03F 2203/45586; H03F 1/30; H03M 3/43; H03M 3/458

USPC ........................................................ 330/9, 51
See application file for complete search history.

(56) References Cited

U.S. PATENT DOCUMENTS

| | | | | |
|---|---|---|---|---|
| 6,310,515 B1 * | 10/2001 | Moldsvor | ............ | G11C 27/026 |
| | | | | 327/95 |
| 7,167,119 B1 | 1/2007 | Lei et al. | | |
| 7,439,889 B2 * | 10/2008 | Fujimoto | ................ | H03M 3/37 |
| | | | | 341/172 |
| 9,525,426 B2 * | 12/2016 | Stojanovic | ............ | H03M 3/458 |
| 9,787,291 B1 * | 10/2017 | Reindl | ................ | H03H 19/004 |
| 11,196,339 B1 | 12/2021 | Jodka et al. | | |
| 2006/0119412 A1 * | 6/2006 | Wei | ......................... | H03F 3/005 |
| | | | | 327/337 |
| 2018/0076779 A1 * | 3/2018 | Wang | ...................... | H03F 3/393 |

FOREIGN PATENT DOCUMENTS

EP          1900101 B1      1/2011

* cited by examiner

*Primary Examiner* — Khanh V Nguyen
(74) *Attorney, Agent, or Firm* — Kowert, Hood, Munyon, Rankin & Goetzel, P.C.; Scott W. Pape; Dean M. Munyon

(57) ABSTRACT

A high input impedance switched capacitor amplifier is disclosed. The switched capacitor amplifier includes at least a first buffer circuit configured to charge a first plurality of capacitors during a first time period. A switch circuit is configured to, during a second time period, cause a modification of an amount of charge stored on one of the first plurality of capacitors by coupling an input signal directly to the one of first plurality of capacitors. An amplifier circuit is configured to, based on a sampling voltage present on one of the first plurality of capacitors, generate an output signal.

20 Claims, 15 Drawing Sheets

HIGH INPUT IMPEDANCE SWITCHED-CAPACITOR AMPLIFIER

BACKGROUND

Technical Field

This disclosure is directed to electronic circuits, and more particularly, to switched capacitor amplifiers.

Description of the Related Art

Switched-capacitor amplifiers are amplifier circuit that sample an input signal before transferring it to the input of an amplifier. A switched-capacitor amplifier may, for example, sample the voltage of an input signal using capacitors, followed by a transfer of the sample from the capacitor to amplifier inputs. Switches may be used to connect the inputs to the capacitors, as well as connecting the capacitors to the amplifier inputs.

Switched-capacitor amplifiers may be utilized in a wide variety of applications. These applications include sigma-delta (EA) analog-to-digital converters (ADCs), filters, power converters, and comparators, among others.

SUMMARY

The present disclosure is directed to a high input impedance switched capacitor amplifier. In one embodiment, a switched capacitor amplifier includes at least a first buffer circuit configured to charge a first plurality of capacitors during a first time period. The buffer input is connected to an input signal to be processed. A switch circuit is configured to, during a second time period, cause a modification of an amount of charge stored on one of the first plurality of capacitors by coupling an input signal directly to the one of first plurality of capacitors. An amplifier circuit is configured to, based on a sampling voltage present on one of the first plurality of capacitors, generate an output signal.

In one embodiment, the switched capacitor amplifier is arranged to receive a differential input signal. A differential embodiment includes a first buffer circuit configured, during a first time period, to charge a first set of capacitors based on a voltage level of a first polarity of a differentially encoded input signal, and a second buffer circuit configured, during the first time period, to charge a second set of capacitors based on a voltage level of a second polarity of the differentially encoded input signal. A switch circuit configured to modify, during a second time period, a first amount of charge stored in a first capacitor of the first set of capacitors and modify, during the second time period, a second amount of charge stored in a first capacitor of the second set of capacitors. The switch circuit is further configured to cause generation of first and second sample voltages using respective voltages across the first and second sets of capacitors. An amplifier circuit configured to generate an output signal using the first and second sample voltages.

BRIEF DESCRIPTION OF THE DRAWINGS

The following detailed description makes reference to the accompanying drawings, which are now briefly described.

DETAILED DESCRIPTION OF EMBODIMENTS

Figure 1:
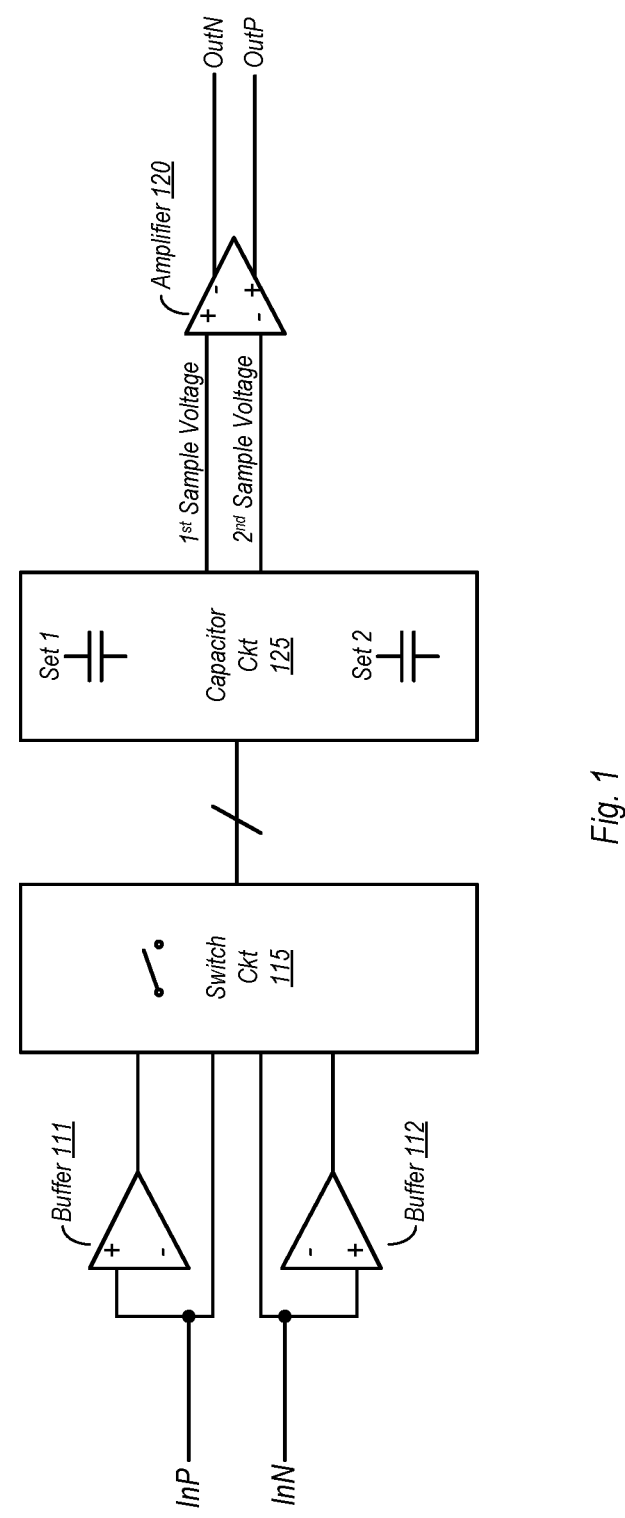
FIG. 1 is a block diagram of one embodiment of a switched capacitor amplifier.

The present disclosure is directed to a switched capacitor amplifier having a high input impedance. Switched capacitor amplifiers are used in a wide variety of circuits, such as sigma-delta analog-to-digital converters (ADCs), power converters, and so on. It is desirable to have a high input impedance to a switched capacitor, as a low impedance indicates that there is loading and thus that input signal is not delivered with desired power/voltage. This can induce gain errors, settling time errors, and signal distortions.

To avoid loading, it is desirable to increase the input impedance of a switched capacitor amplifier. One way this has been accomplished is to feed the input signals to a unity gain buffer that charges corresponding sampling capacitors, followed by directly coupling the input to the same sampling capacitors. This is accomplished within a single phase of a sampling clock, but requires extra clock signals to change the signal coupled to the sampling capacitor. The extra clock signals consume a greater amount of power, dividing up one of the phases with the extra clock signals. In addition to consuming more power, the operating speed and bandwidth are limited.

The present disclosure makes use of the insight that it is possible to use buffers to receive the inputs to the switched capacitor amplifier while also eliminating any induced error without requiring the addition of extra clock signals. Instead, the switched capacitor amplifier of the present disclosure provides extra capacitors on the input so that coarse and fine charging can be done in different phases of a single clock signal, thereby obviating the need for extra clocks to sub-divide one of the phases into sub-phases. In a first phase of a clock signal, the inputs to the switched capacitor amplifier are provided to corresponding buffers (which have high input impedance). Using the buffer supply voltage, the buffers charge respective ones of first and second subsets of sampling caps with a value that includes the input voltage plus error. The sampling capacitors are arranged such that buffer errors are pushed to both positive and negative inputs of integrator, hence substantially reducing or eliminating the errors induced by the buffers. During this phase sampling capacitors push charge to respective inputs of the integrator. During a second phase, the inputs are coupled directly to respective ones of a second subset of the sampling caps. As in first phase second subset of caps were charged with input voltage plus error, during second phase the input has to provide only minimal charge proportional to buffer error. As input has to provide only minimal charge, high impedance is obtained.

While the embodiment described in the previous paragraph is directed to receiving a differential signal, embodiments utilizing a single-ended input are also possible and contemplated.

The solution disclosed herein may consume less power than other solutions to the problem of providing high input impedance for a switched capacitor amplifier. The amount of area consumed by the extra capacitors is minimal, while no extra clock signals are required, thereby minimizing the power consumption. Furthermore, since no extra clock signals are required, the switched capacitor amplifier of the present disclosure can be operated at higher frequencies.

A discussion of various embodiments of a switched capacitor amplifier in accordance with this disclosure follows. The discussion begins with a block diagram of, followed by schematic diagrams directed to an embodiment of a switched capacitor amplifier as disclosed herein. The discussion includes a description of the operation with regard to the various switch states. A number of different embodiments, including a single-ended embodiment as well as variations on the differential embodiments, are then described. A sigma-delta ADC is also described to illustrate one possible use case for the switched capacitor amplifier of the present disclosure (although others are possible and contemplated). Thereafter, methods of operating a switched capacitor amplifier in accordance with this disclosure are described. The discussion concludes with a description of example systems in which the switched capacitor amplifier of the present disclosure may be implemented.

Switched Capacitor Amplifier with High Input Impedance:

FIG. 1 is a block diagram of one embodiment of a switched capacitor amplifier. In the embodiment shown, switched capacitor amplifier 100 is arranged to have a high input impedance to prevent loading on the circuit providing input signals thereto.

Switched capacitor amplifier 100 in the embodiment shown is arranged to receive an input signal that is differentially encoded, although this signal may nevertheless be considered an analog signal to be sampled. Buffer 111 is coupled to receive a first component of the input signal, while buffer 112 is coupled to receive a second component of the input signal, InN. Both buffers 111 and 112 may present very high input impedance to prevent loading on the circuit from which InP and InN originate.

It is noted that embodiments arranged for single-ended input signals are also possible and contemplated, and such embodiments may include only a single instance of a buffer circuit coupled to receive an input signal.

Switched capacitor amplifier 100 also includes a switch circuit 115 and a capacitor circuit 125. Switch circuit 115 in the embodiment shown includes a number of switches that connect various portions of the circuit to other portions on different clock phases. Capacitor circuit 125 includes a number of different capacitors that may be used to capture samples that are provided to amplifier circuit 120. During a first phase of the clock signal, certain ones of switches in switch circuit 115 are closed (while others remain open) to cause buffers 111 and 112 to charge correspondingly coupled capacitors. During a second phase of the clock signal, the switches that were open during the first phase are closed, and vice versa. Furthermore, during the second phase, the input signals, InP and InN in this example embodiment, are coupled directly to ones of a subset of capacitors in capacitor circuit 115. In coupling these input signals directly to corresponding ones of a subset of capacitors, the amount of charge on (and thus the respective voltages across) are modified to remove any error introduced by the buffer circuits.

Based on the charging and charge modification of the various capacitors in capacitor circuit 125, sample voltages are generated and provided to amplifier circuit 120. These sample voltages are then used to generate an output signal that is provided to downstream circuitry for further processing. In the illustrated embodiment, the output signal is a differential output signal including the components OutP and OutN.

Figure 2:
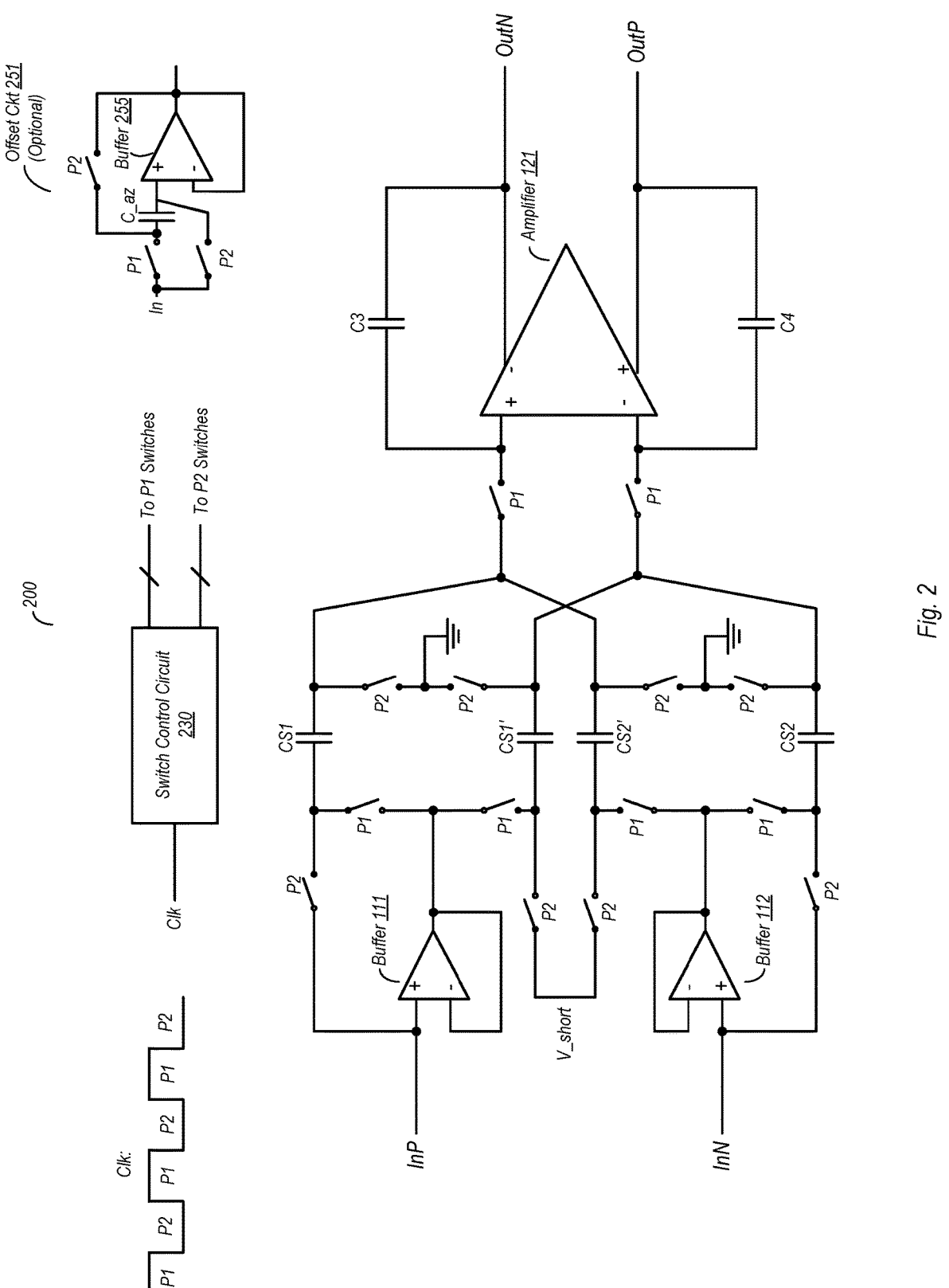
FIG. 2 is a schematic diagram of one embodiment of a switched capacitor amplifier.

FIG. 2 is a schematic diagram of one embodiment of a switched capacitor amplifier in accordance with the disclosure. In the embodiment shown, switched capacitor amplifier 200 is arranged to receive a differentially encoded input signal having components InP and InN. Buffer 111 is coupled to receive the InP component on its non-inverting input. Similarly, buffer 112 is coupled to receive the InN component on its non-inverting input. Each of buffers 111 and 112 have their respective output coupled in a negative feedback configuration to their respective inverting inputs, and are thus configured here as unity gain buffers. Accordingly, the output voltages generated by buffers 111 and 112 correspond to the voltages of their respective input signals, plus any errors induced by the buffers themselves.

A switching circuit in the embodiment shown includes a plurality of switches that are used, during the different phases of a two-phase clock signal, to connect the sampling capacitors (CS1, CS1', CS2, and CS2') to other components of the circuits. Those switches labeled P1 are closed during a first phase of the clock signal illustrated in the upper left-hand corner of the drawing. Meanwhile the switches labeled P2 are open during the first phase. During a second phase of the clock signal, the switches labeled P2 are closed, while the switches labeled P1 are open. Control of the switches in the embodiment shown is carried out by switch control circuit 230, which is coupled to receive the clock signal, Clk, and generate switch control signals that are provided to the P1 and P2 switches.

Switched capacitor amplifier 200 also includes an amplifier circuit 121, which is coupled to receive sampling voltages on its inputs. In this particular embodiment, the sampling voltages are received during the first phase of the clock signal, when the P1 switches are closed. Amplifier circuit 121 in this embodiment is implemented as an integrated, with capacitors C3 and C4 coupled in a feedback configuration between amplifier outputs and inputs.

In some embodiments, optional offset cancellation circuits may be implemented as shown in the upper right-hand corner of the drawing. When implement, and offset cancellation circuit includes a capacitor C_az coupled to the non-inverting input of buffer 255 (which may correspond to buffers 111 and 112 when each is implemented with offset cancellation). The input signal, In, may be coupled to a terminal of C_az when the corresponding P1 switch is closed during the first phase of the clock signal. The voltage generated across this capacitor is input into buffer 255, which in turn charges corresponding sampling capacitors coupled to the output of buffer 255. During the second phase of the clock signal, the P2 switches are closed, with the input coupled directly to both the non-inverting input and the output of buffer 255, effectively sampling the buffer offset. This buffer offset is then removed in the next first phase of the clock signal (when the P1 switches are closed).

Figure 3:
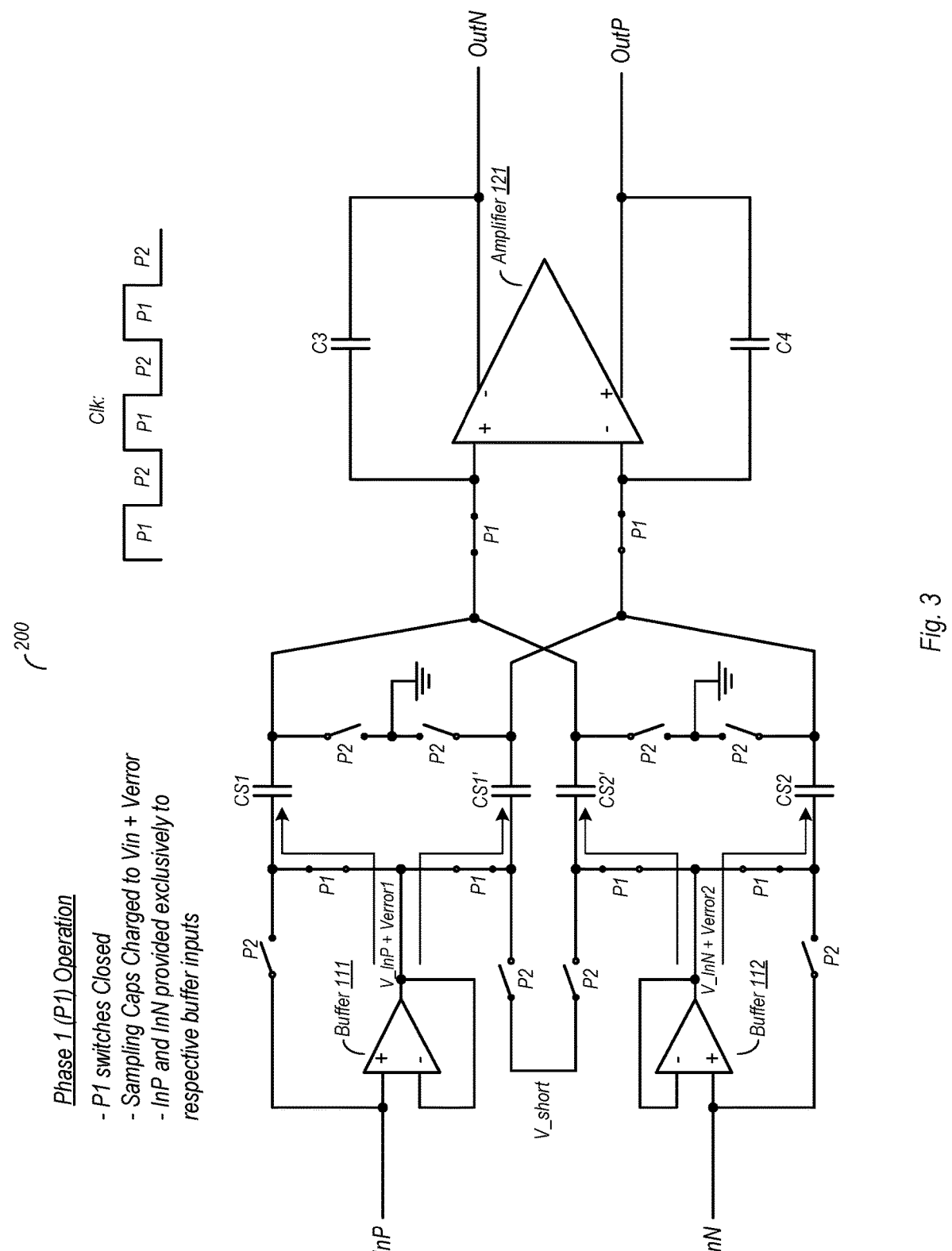
FIG. 3 is a schematic diagram illustrating operation of a switching circuit of a switched capacitor amplifier during a first clock phase.

Operation of switched capacitor amplifier 200 is now discussed in further detail with reference to FIGS. 3 and 4. FIG. 3 is used to illustrate operation during the first phase (P1) of operation, while FIG. 4 illustrates the operation during the second phase (P2) of operation.

During the first phase of the clock cycle of the clock signal, Clk, the switches labeled P1 are closed. When the P1 switches are closed, the inputs InP and InN are provided exclusively to the non-inverting inputs of buffers 111 and 112, respectively. Buffer 111 charges sampling capacitors CS1 and CS1' with a voltage equivalent to V_InP+Verror1. The voltage V_InP is substantially equal to the voltage of the input signal, while Verror1 is an error voltage introduced by buffer 111. Buffer 112 charges capacitors CS2 and CS2' to V_InN+Verror2. The voltage V_InN is substantially equal to the voltage of the InN signal, while Verror2 is an error voltage introduced by buffer 112.

Additionally, when the P1 switches are closed, sampling voltages that were generated in a previous cycle are pushed from capacitors CS1' and CS2' into the inputs of amplifier 121. As previously noted, amplifier 121 in the embodiment shown is connected in an integrator configuration, and thus capacitors C3 and C4 are also charged. Note that buffer 111 error, Verror1, is connected to CS1 and CS1', which are coupled to positive and negative terminals of amplifier 121. Accordingly, the differential output voltage (OutP-OutN) would reject errors from buffer 111. This mechanism also applies to buffer 112.

Figure 4:
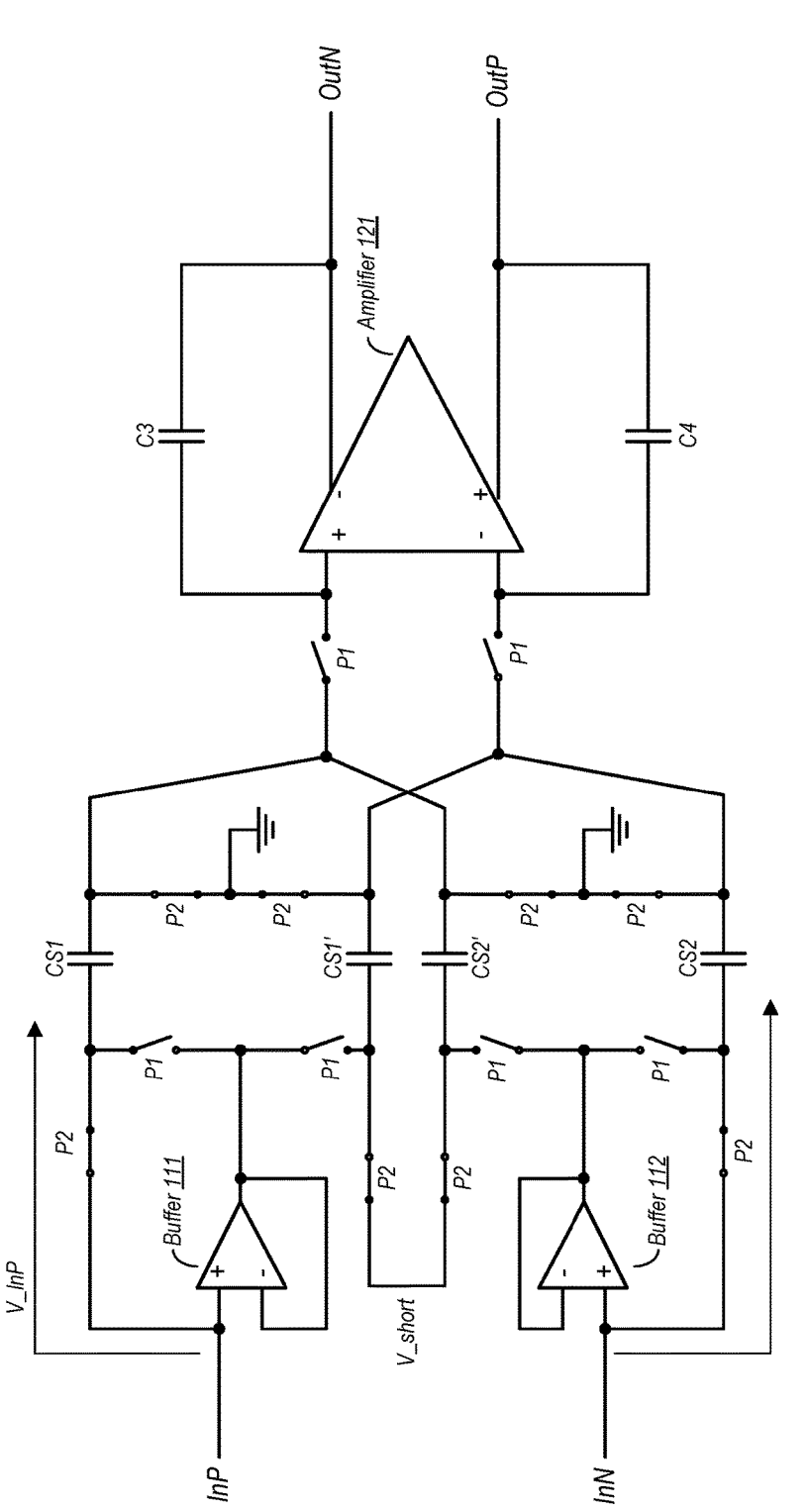
FIG. 4 is a schematic diagram illustrating operation of a switching circuit of a switched capacitor amplifier during a second clock phase.

During the P2 phase of the clock cycle, as illustrated in FIG. 4, the input signals are directly coupled to respective sampling capacitors, while the outputs of the buffers are isolated by the opening of the P1 switches. The voltage of the input signal InP, V_InP is provided to a terminal of sampling capacitor CS1 while the voltage of the input signal InN, V_InN, is provided to terminal of sampling capacitor CS2. As result of this arrangement, the amount of charge on these sampling capacitors is modified by an amount equal to the buffer error. Hence, the inputs have to provide only a minimal charge proportional to the buffer errors, thus the input impedance of the system is boosted.

Additionally, the closing of the P2 switches couples CS1' and CS2' at the node Vshort. This arrangement may be used to block common mode voltage injection in differential embodiments such as that shown here, as the voltages across CS1' and CS2' at this time become equalized.

On the next clock cycle, during the first phase when the P1 switches are closed again, the sampled voltages, with error differentially removed, are transferred to the inputs of amplifier circuit 121, which generates the components of the output signal (OutP and OutN) based thereon.

As noted above, the arrangement of the switched capacitor amplifier disclosed herein may operate using a single, two-phase clock signal, with switching performed in the first and second phases (e.g., the P1 switches active in the first phase, P2 switches active in the second phase). Thus, instead of using time multiplexing in a single phase as some switched capacitor amplifiers use, the switched capacitor amplifier of the present disclosure utilizes space multiplexing by adding extra capacitors and using only the single clock signal. This may result in lower power consumption, as fewer clock signals are generated to support operation. Furthermore, by using only a single clock signal, the switched capacitor amplifier of the present disclosure may be operated at a higher frequency.

Figure 5A:
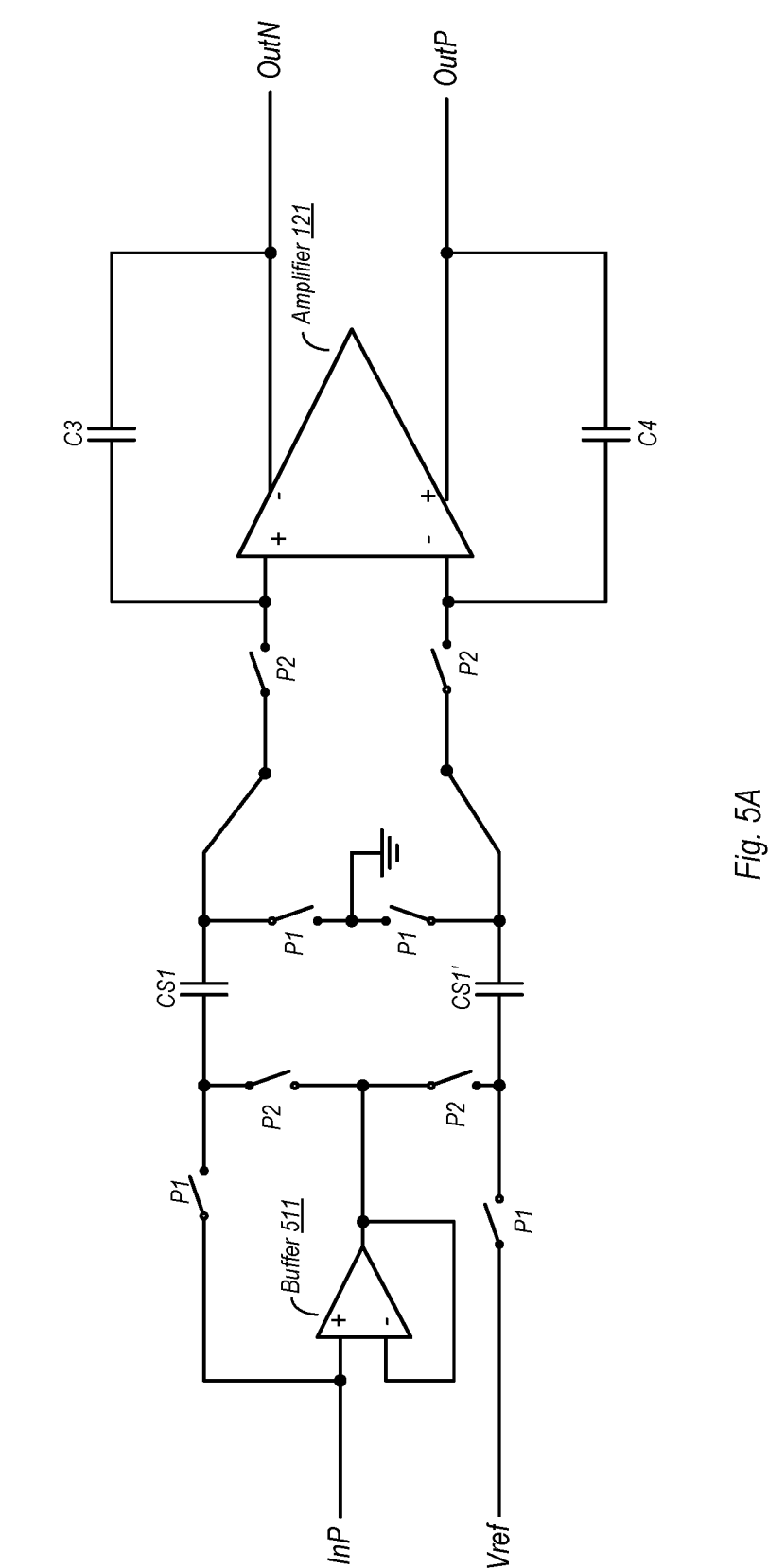
FIG. 5A is a schematic diagram of another embodiment of a switched capacitor amplifier.

Variations on Embodiments of a Switched Capacitor Amplifier:

FIG. 5A is a schematic diagram of one embodiment of a switched-capacitor amplifier according to the present disclosure that receives a single-ended signal. In the embodiment shown, switched capacitor amplifier 500 includes a single instance of a buffer 511, which is connected as a unity gain buffer similar to those of the previously discussed embodiments. An input signal InP is provided to the non-inverting input of buffer 511. Switched capacitor amplifier 500 is also coupled to receive a reference voltage, Vref. Also included are a number of switches, some of which are active during a first phase of a clock signal (P1) and others which are active during a second phase of the clock signal. An amplifier circuit 121 is coupled to receive sample voltages generated on the sampling capacitors CS1 and CS1'. Amplifier 121 is arranged here as an integrator, with capacitors C3 and C4 coupled between input and output ports.

During the first phase of the clock signal, the P1 switches are closed, and InP is coupled directly to charge sampling capacitor CS1, while CS1' is charged by Vref. With the other terminals of these CS1 and CS1' coupled to ground due to the closed P1 switches during the first phase of the clock signal, the charge on CS1 (and thus the voltage there across) is based on the voltage of InP.

During the second phase, the P1 switches are opened and the P2 switches (which were open during the first phase) are closed. Buffer 511 charges CS1 and CS1' based on the voltage of InP plus an error voltage. At the beginning of the second phase, the voltage across CS1 is transferred to the non-inverting input of amplifier 121, while the voltage across CS1' is transferred to the inverting input. The buffer errors are transferred equally to both non-inverting and inverting inputs of amplifier 121, and thus are cancelled when we consider differential output (OutP-OutN). The operation described above then repeats when the first phase of the next clock cycle commences and the P1 switches are closed once again, while the P2 switches are opened. During the first phase, (P1), the input has to provide only minimal charge proportional to buffer error (as CS1 was precharged to input+buffer error in P2), due to minimal charge extraction from input, the effective impedance is boosted.

It is noted that while amplifier circuit 121 is shown here as being arranged to provide a differential output signal, embodiments are also possible and contemplated in which a single-ended output signal is provided.

Figure 5B:
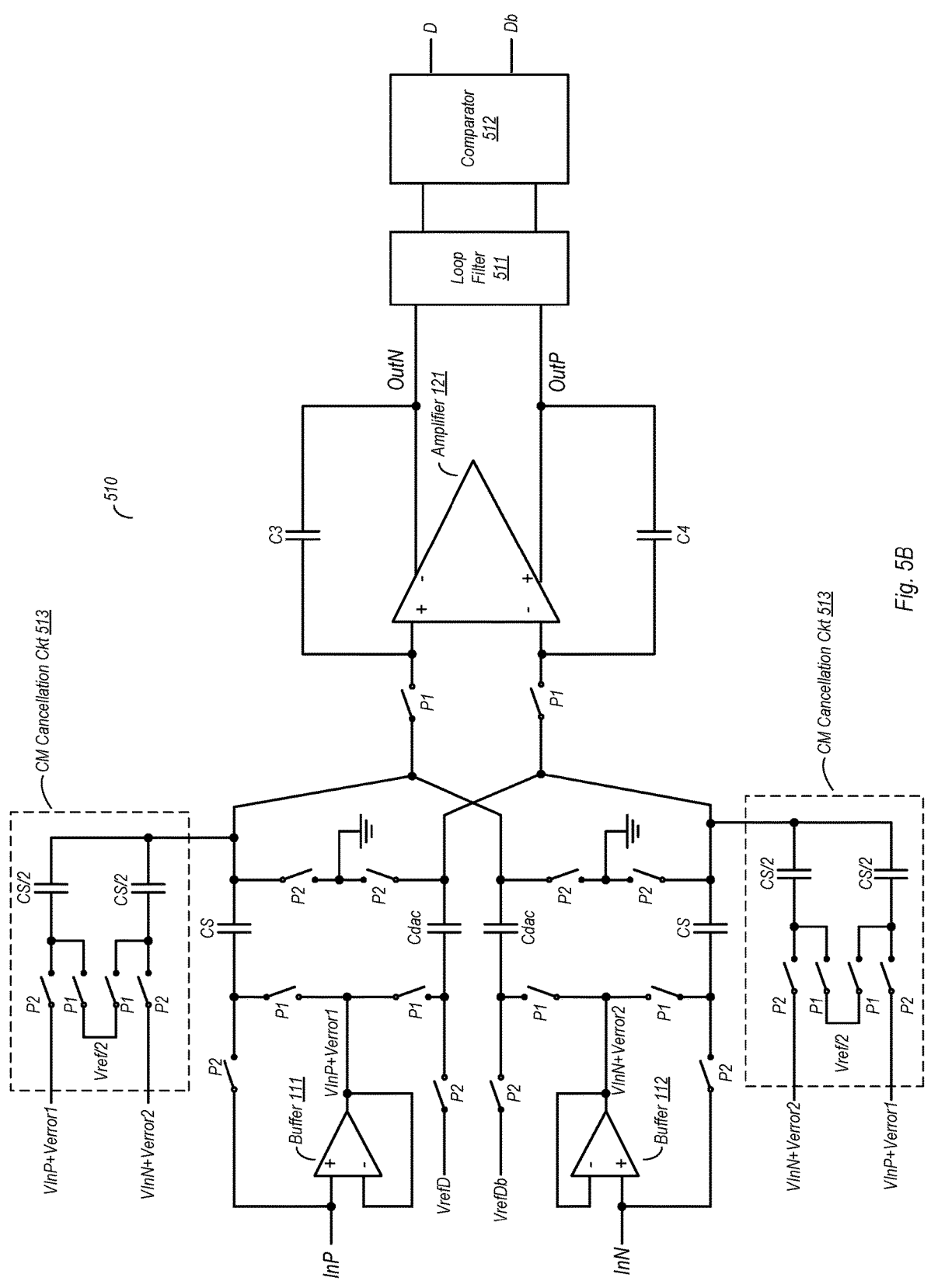
FIG. 5B is a schematic diagram of another embodiment of a switched capacitor amplifier.

FIG. 5B is schematic diagram of another embodiment of a switched capacitor amplifier according to the present disclosure. In the embodiment shown, switched capacitor amplifier 510 may be utilized in a sigma-delta ADC that includes loop filter 511 and comparator 512, and may utilize common mode cancellation. The circuit includes two common mode cancellation circuits 513 that are each coupled to receive output voltages from the buffers 111 and 112, which are VInP+Verror1 and VinN+Verror2, respectively. Generally, the output voltages of the buffers are equivalent to the respective voltages of the input signal plus error introduced therein. During the P2 phase, these voltages are used to charge the capacitors labeled CS/2, which have one half the capacitance value of the sampling capacitors CS. During the subsequent P1 phase, the voltages across these capacitors are equalized by closing the corresponding switches, thereby canceling the common mode voltage present in the buffer output signals.

The embodiment shown in FIG. 5B also utilizes voltage VrefD and VrefDb, which are provided from corresponding digital-to-analog converters (DACs) in the feedback path of the sigma-delta ADC in which the switched capacitor amplifier is implemented. In particular, the output signals from comparator 512, D and Db, are provided to DACs that in turn generate the voltage VrefD and VrefDb, respectively. During the P2 phase, these voltages are applied to the respective capacitors labeled Cdac (which may have the substantially the same capacitance values as the sampling capacitors CS).

Figure 5C:
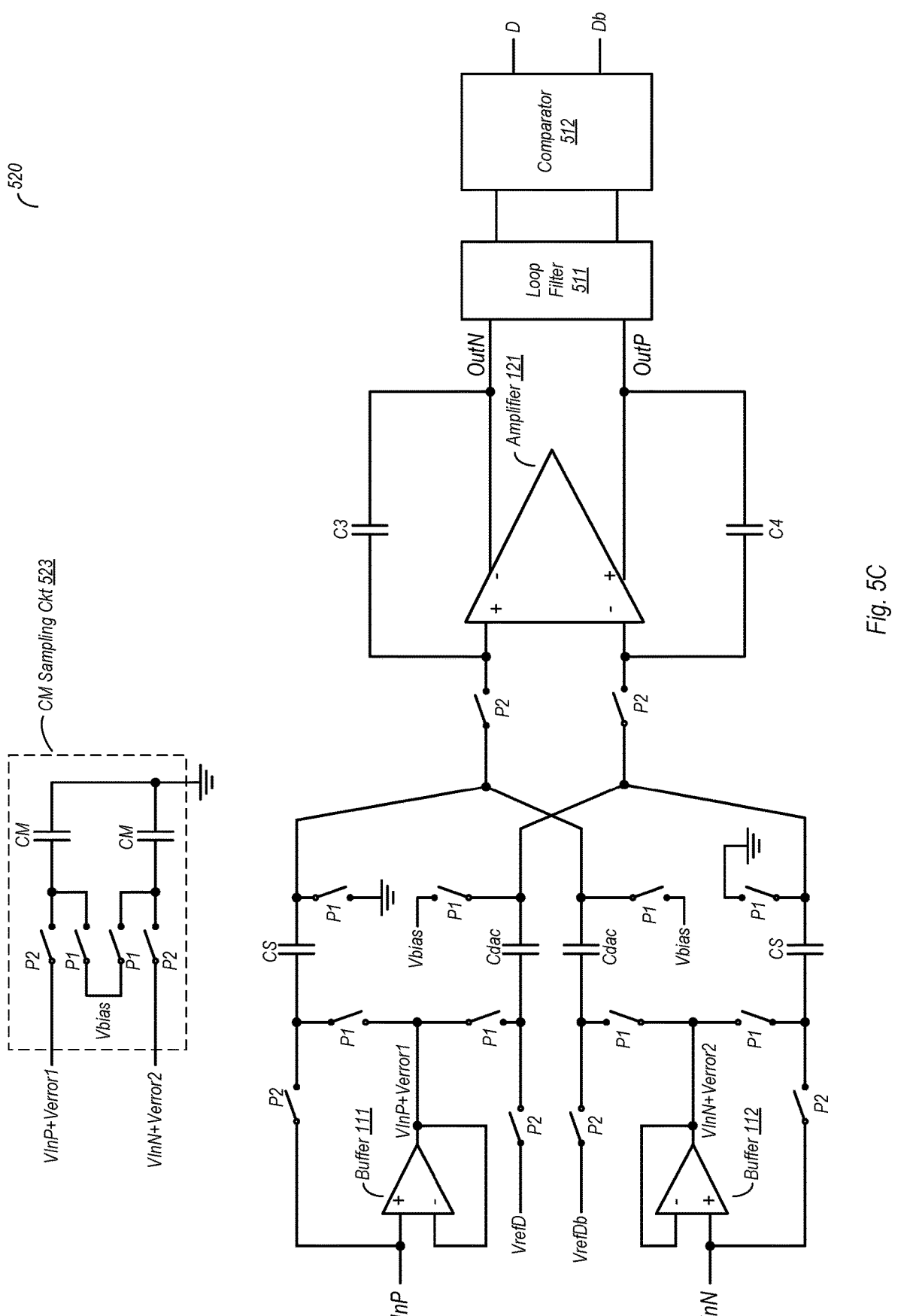
FIG. 5C is a schematic diagram of another embodiment of a switched capacitor amplifier.

FIG. 5C is another embodiment of a switched capacitor amplifier per the present disclosure. In this particular embodiment, switched capacitor amplifier 520 utilized buffer assisted common mode sampling. In particular, common mode sampling circuit 523. During the P2 phase, the output voltages of buffers 111 and 112, VinP+Verror1 and VinN+ Verror2, respectively, are provided to corresponding capacitors CM of common mode sampling circuit 523. During the subsequent P1 phase, the closing of the P1 switches in common mode sampling circuit equalizes the voltages across both CM capacitors to generate a voltage Vbias. The Vbias voltage is conveyed to the Cdac capacitors that are also charged by the buffer output voltages during the P1 phase.

Figure 5D:
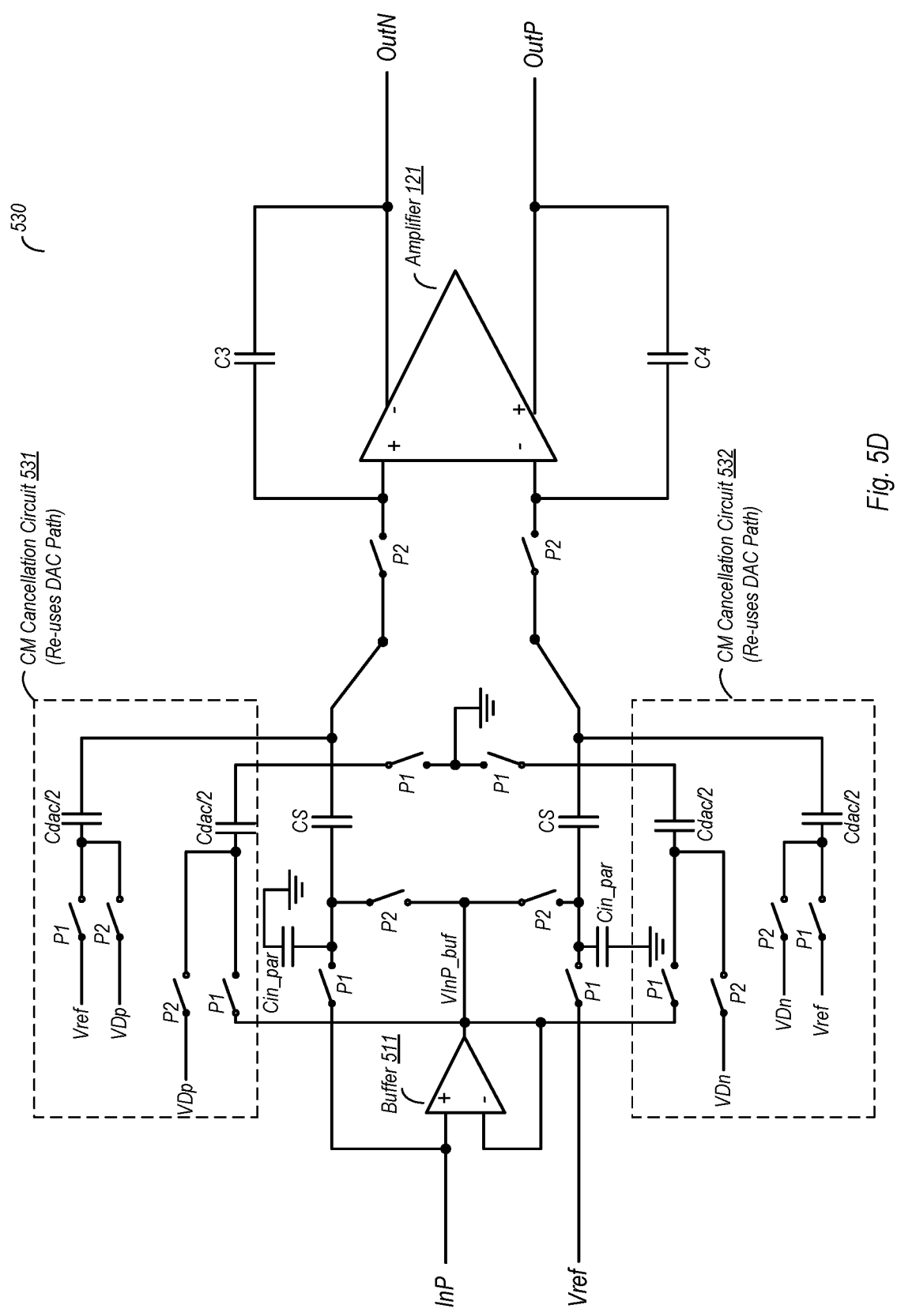
FIG. 5D is a schematic diagram of another embodiment of a switched capacitor amplifier.

FIG. 5D is another embodiment of a single-ended implementation of a switched capacitor amplifier in accordance with the present disclosure. In the embodiment shown, switched capacitor amplifier 530 is arranged for used in a sigma-delta ADC, and utilizes the DAC output paths with common mode cancellation. The voltages VDp and VDn are generated using DACs (not shown here) that provide feedback from the output of a comparator (also not shown here) of a sigma-delta ADC. During the P2 phase, the voltages VDp and VDn are applied as inputs to common mode cancellation circuits 531 and 532, respectively, and thus to the capacitors labeled Cdac/2 (which may have substantially one half the capacitance value of the sampling capacitors Cs). During the subsequent P1 phases, one of the Cdac/2 capacitors of each common mode cancellation circuit 531/532 is charged by a reference voltage, Vref (which may be generated by a bandgap or other suitable circuit) while the other Cdac/2 is charged by the output voltage, VinP_buf, from buffer 511. This arrangement allows for the cancellation of the common mode voltage when applied to the inputs of amplifier 121.

It is noted that the capacitors Cin_par shown here represent parasitic capacitances on their respective circuit nodes.

Figure 5E:
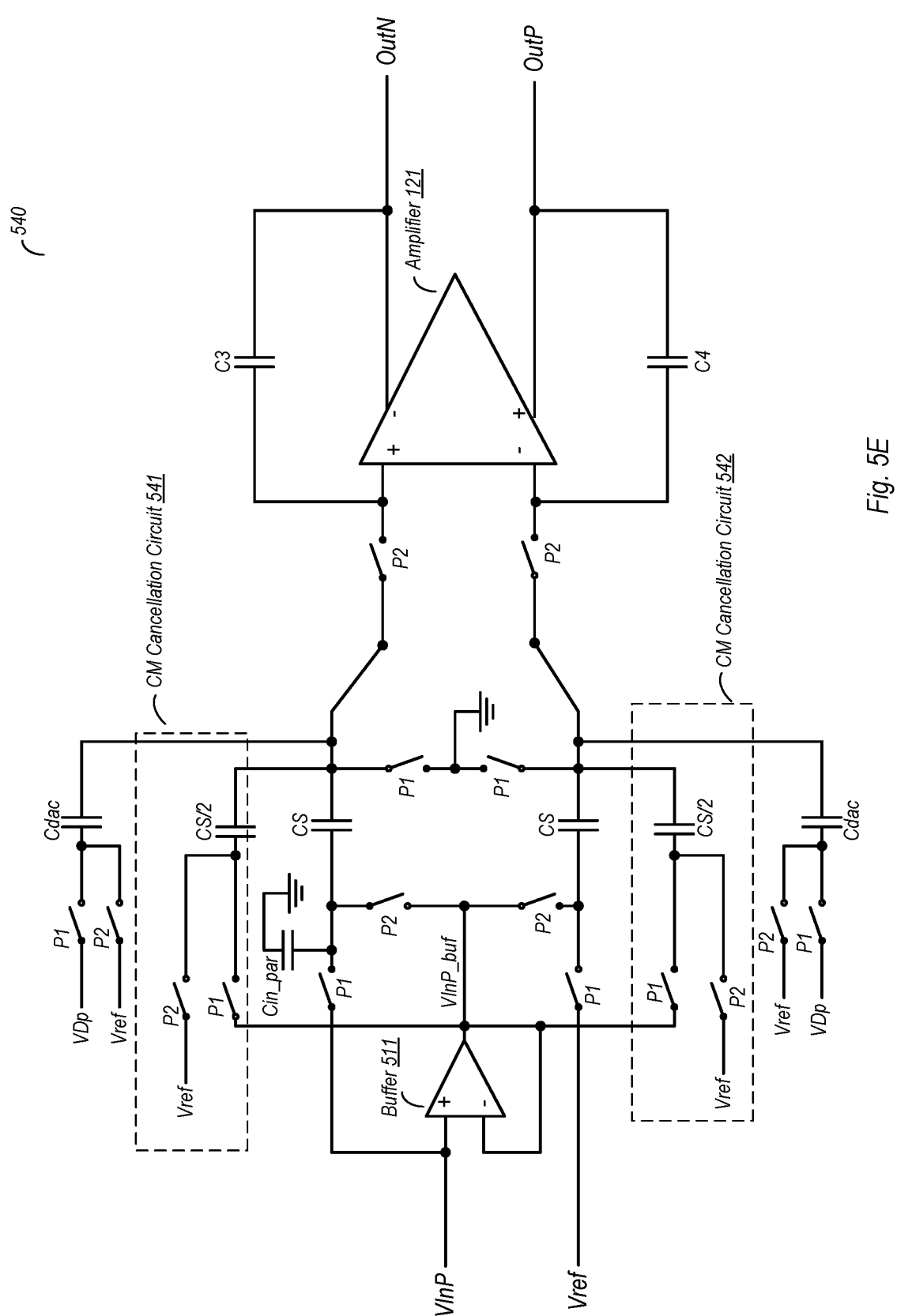
FIG. 5E is a schematic diagram of another embodiment of a switched capacitor amplifier.

FIG. 5E is another embodiment of a single-ended switched capacitor amplifier per the present disclosure. As with various other embodiments, switched capacitor amplifier 540 is arranged for use in a sigma-delta ADC, and utilizes the voltage VDp that is generated by a DAC (not shown here) in the feedback, based on a comparator output signal (comparator also not shown here). This embodiment includes common mode cancellation circuits 541 and 542. During the P2 phase, the Cdac and CS/2 capacitors are charged by the reference voltage, Vref. During the subsequent P1 phase, the DAC output voltage VDp is used to charge the Cdac and CS/2 capacitors. This may effectively cancel the common mode voltage from the voltages applied to the input terminals of amplifier 121.

Figure 5F:
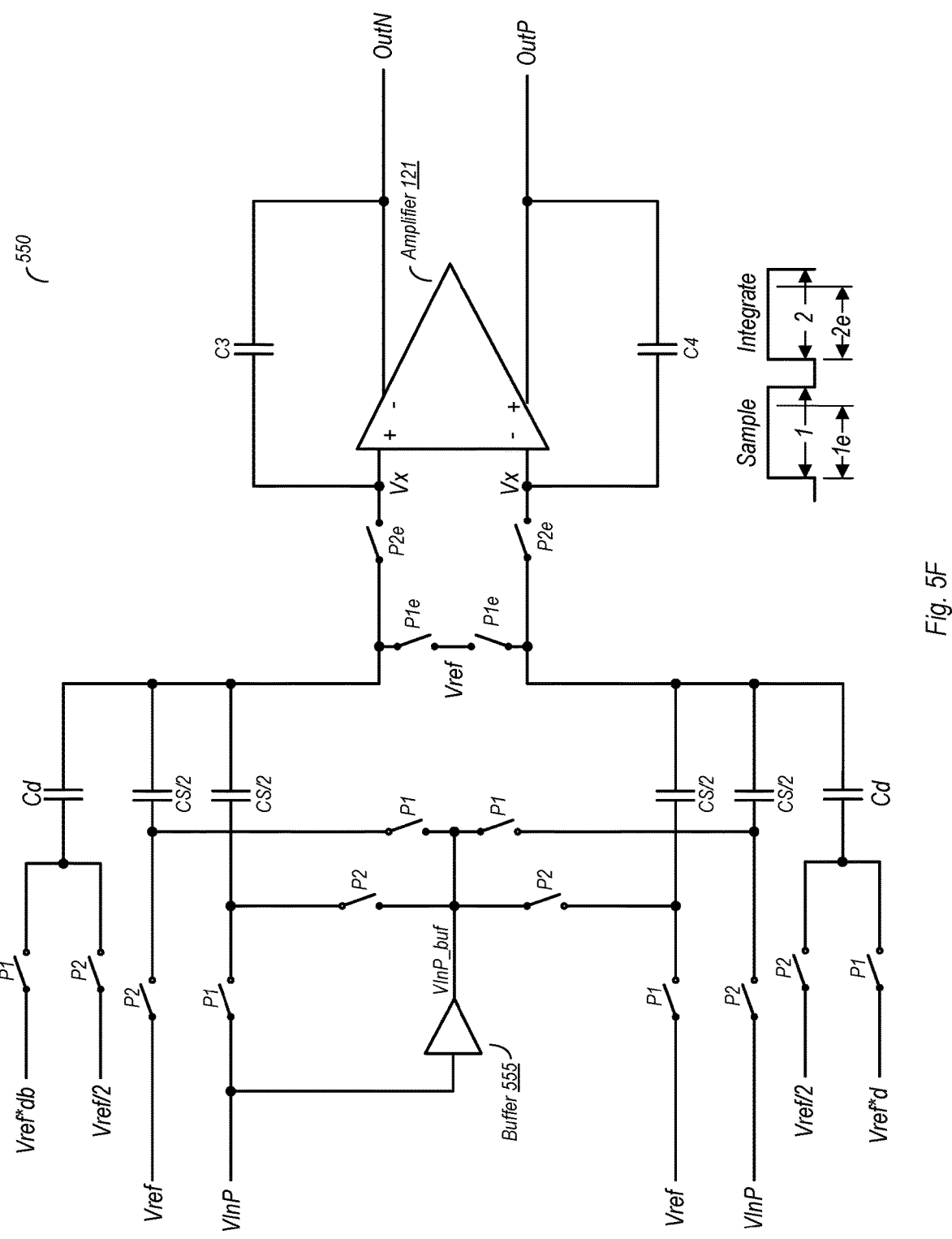
FIG. 5F is a schematic diagram of another embodiment of a switched capacitor amplifier.

FIG. 5F is another embodiment of a single-ended switched capacitor amplifier per the present disclosure. In this embodiment, the switching of switched capacitor amplifier 550 is based on sample and integrate phases, and additionally, on sub-phases. The sample phase 1 includes a sub-phase 1e, while the integrate phase 2 includes a sub-phase 2e. Switches marked P1 in this embodiment are closed during the entirety of the sample phase, while switches marked P1e are closed only during the portion of the sample phase designated 1e. During the sample phase (P1), the output of buffer 555, VInP_buf, charges a first subset of the sampling capacitors coupled thereto. The input, VinP, is also coupled directly to one of the sampling capacitors during the sample phase. During the integrate phase (P2), the output of buffer 555 is connected to capacitors that are part of a second subset, with the second subset including the one capacitor that received the input voltage VinP directly during the sample phase.

During the sample phase, a voltage from, e.g., a DAC, may be provided to the capacitors labeled Cd using voltages Vref*d and Vref*db. During the integrate phase, a voltage Vref/2 (from a reference voltage source, such as another DAC or a bandgap circuit) may be provided to the Cd capacitors.

During the sample phase, the closing of the switches labeled 1e may couple together terminals of each of the sampling capacitors, as well as those labeled Cd during the corresponding sample sub-phase. During the integrate sub-phase, the switches labeled 2e may couple these capacitors to respective inputs of amplifier 121. This results in pushing the sampled voltages with error modification to the inverting and non-inverting inputs of buffer 121.

Figure 5G:
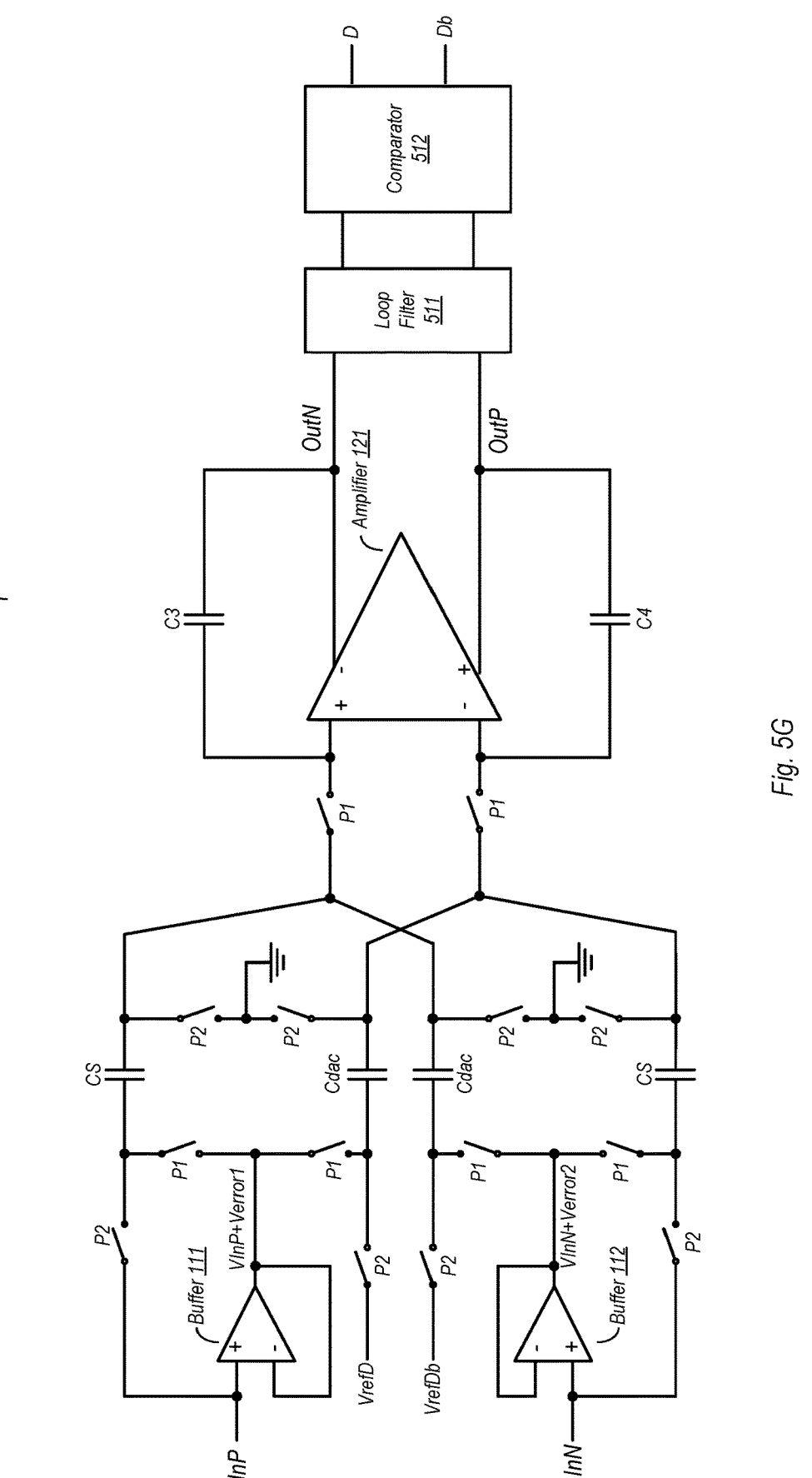
FIG. 5G is a schematic diagram of another embodiment of a switched capacitor amplifier with no common cancellation circuit.

The embodiment shown in FIG. 5G is a variant of the embodiment shown in FIG. 5B, with the common mode cancellation circuit is removed. This circuit may be implemented when the common mode voltage of the input signals is equal to the common mode voltage of a DAC used in certain applications.

Figure 6:
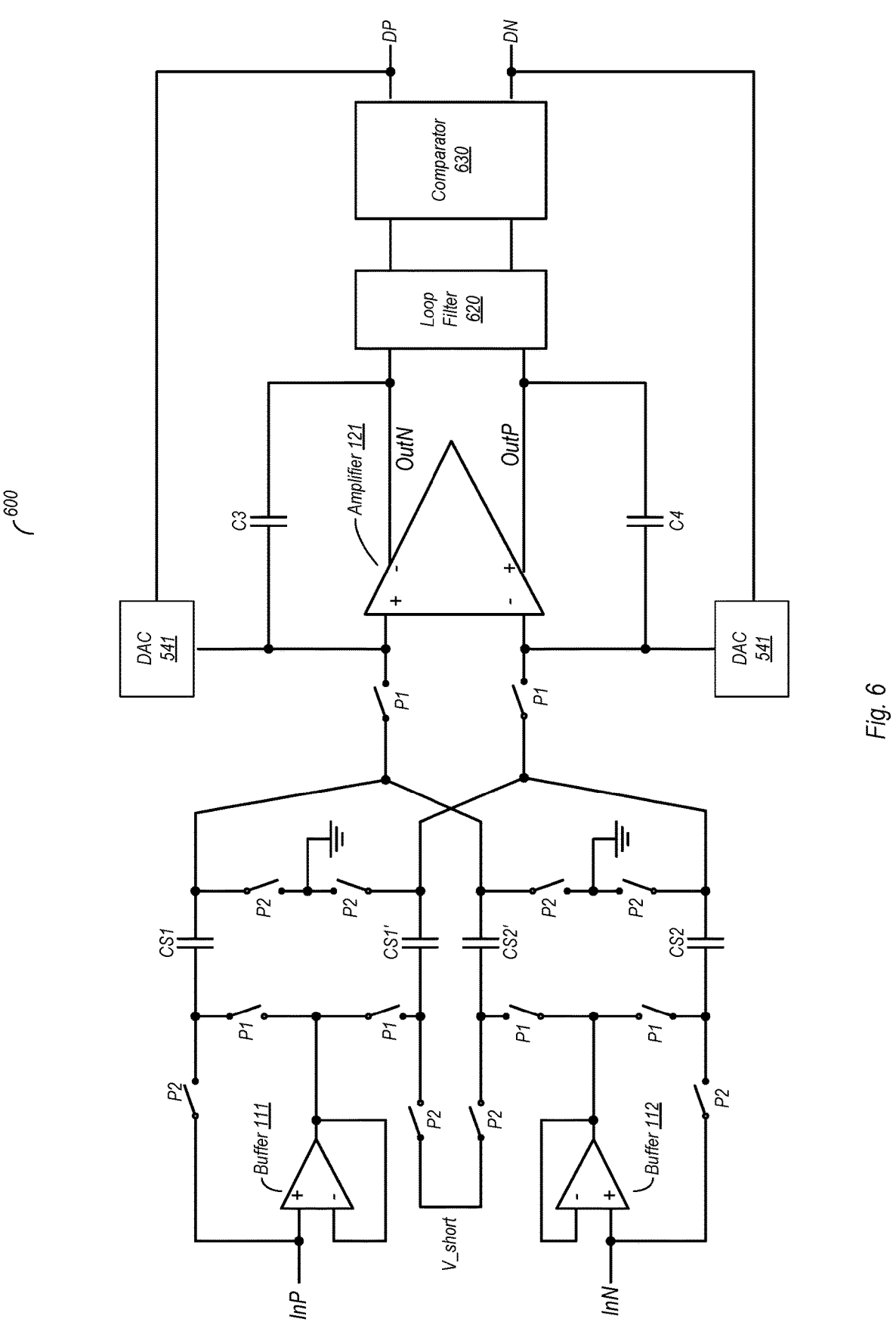
FIG. 6 is a block diagram of one embodiment of a sigma-delta analog-to-digital converter (ADC) utilizing a switched capacitor amplifier.

Sigma-Delta ADC with Switched Capacitor Amplifier:

FIG. 6 is a schematic diagram of one embodiment of a sigma-delta ADC that includes a switched capacitor amplifier in accordance with the present disclosure. In the embodiment shown, sigma-delta ADC 600 includes the components of a switched capacitor amplifier arranged such as that shown in the embodiment of FIGS. 2-4. Additionally, sigma-delta ADC 600 also includes a loop filter 620 coupled to the output of amplifier 121 and a comparator 630. Loop filter 620 is arranged to filter out certain frequency components of the differential output signal received from amplifier 121, while comparator is configured to generate a digital differential output signal (with components DP and DN) to be provided downstream for further processing. Feedback paths from DP and DN are also provided which include digital-to-analog converters (DACs) 541, which provide feedback to the inputs of amplifier 121.

Figure 7:
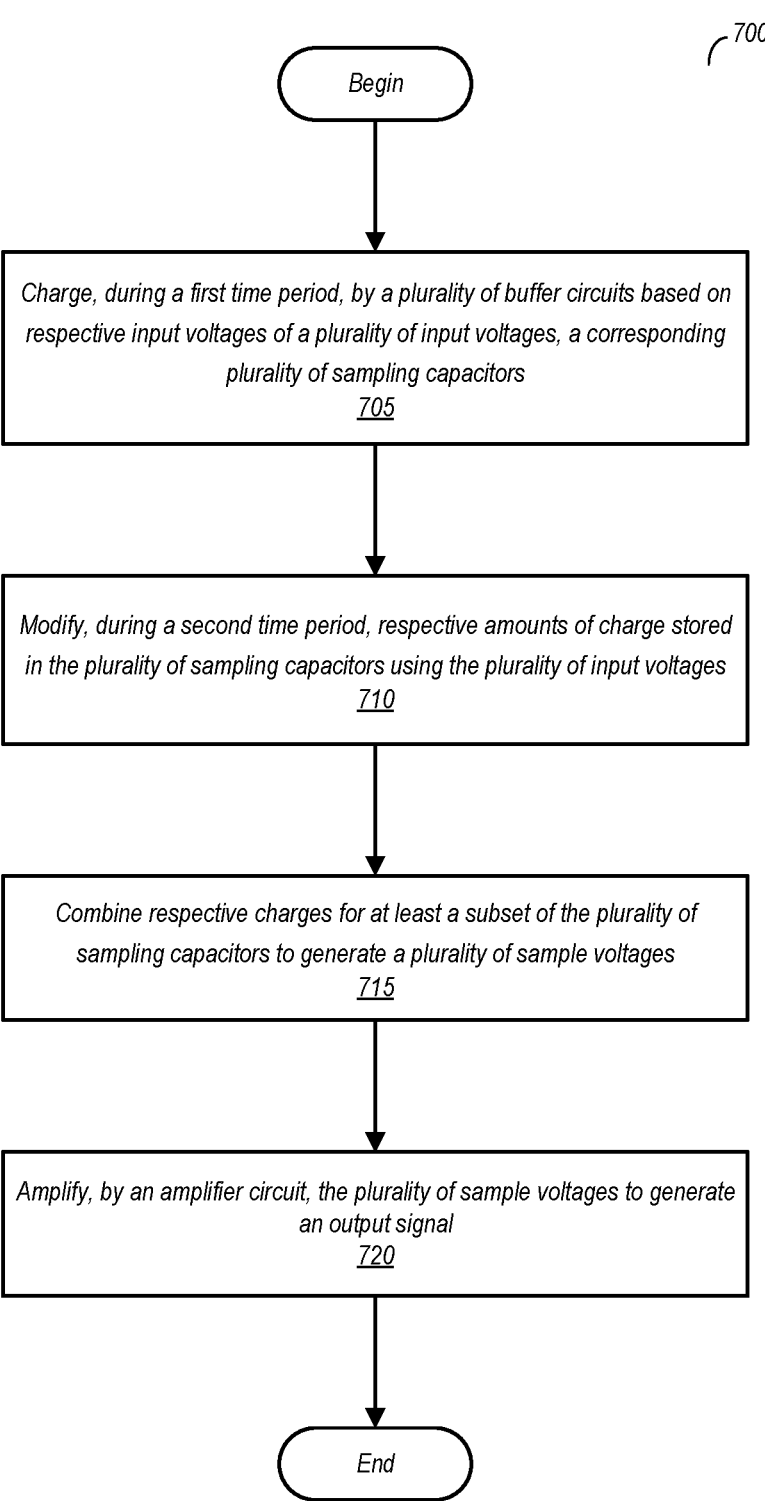
FIG. 7 is a flow diagram of one embodiment of a method for operating a switched capacitor amplifier.

Methods of Operation:

FIG. 7 is a flow diagram of one embodiment of a method for operating a switched capacitor amplifier. Method 700 as discussed herein may be carried out by various embodiments of a switched capacitor amplifier as disclosed herein. Other embodiments of a switched capacitor amplifier capable of carrying out Method 700 but not explicitly discussed herein are also considered to fall within the scope of this disclosure.

Method 700 includes charging, during a first time period, by a plurality of buffer circuits based on respective input voltages of a plurality of input voltages, a corresponding plurality of sampling capacitors (block 705). The method further includes modifying, during a second time period, respective amounts of charge stored in the plurality of sampling capacitors using the plurality of input voltages (block 710). Method 700 further includes combining respective charges for at least a subset of the plurality of sampling capacitors to generate a plurality of sample voltages (block 715) and amplifying, by an amplifier circuit, the plurality of sample voltages to generate an output signal (block 720).

In various embodiments, the plurality of input voltages comprise first and second components of a differential input signal. In such embodiments, modifying respective amounts of charge stored in the plurality of sampling capacitors includes coupling a first component of the differential input signal directly to a first one of the plurality of capacitors and coupling a second component of the differential input signal directly to a second one of the plurality of capacitors.

Various embodiments of the method also include providing a first component of a differential input signal to a first buffer circuit of the plurality of buffer circuits and charging, using the first buffer circuit and based on the first component of the differential input signal, a first subset of the plurality of capacitors. Such embodiments further includes providing a second component of the differential input signal to a second buffer circuit of the plurality of buffer circuits and charging, using the second buffer circuit and based on the second component of the differential input signal, a second subset of the plurality of capacitors. These embodiments may also include creating, using a switching circuit and during the second time period, creating a short circuit between a capacitor of the first subset and a capacitor of the second subset.

In various embodiments, only a single clock signal is provided to the switching circuit of the switched capacitor amplifier. The first period is a first phase (of two phases) of the clock signal, while the second period is a second phase of the two-phase clock signals.

Figure 8:
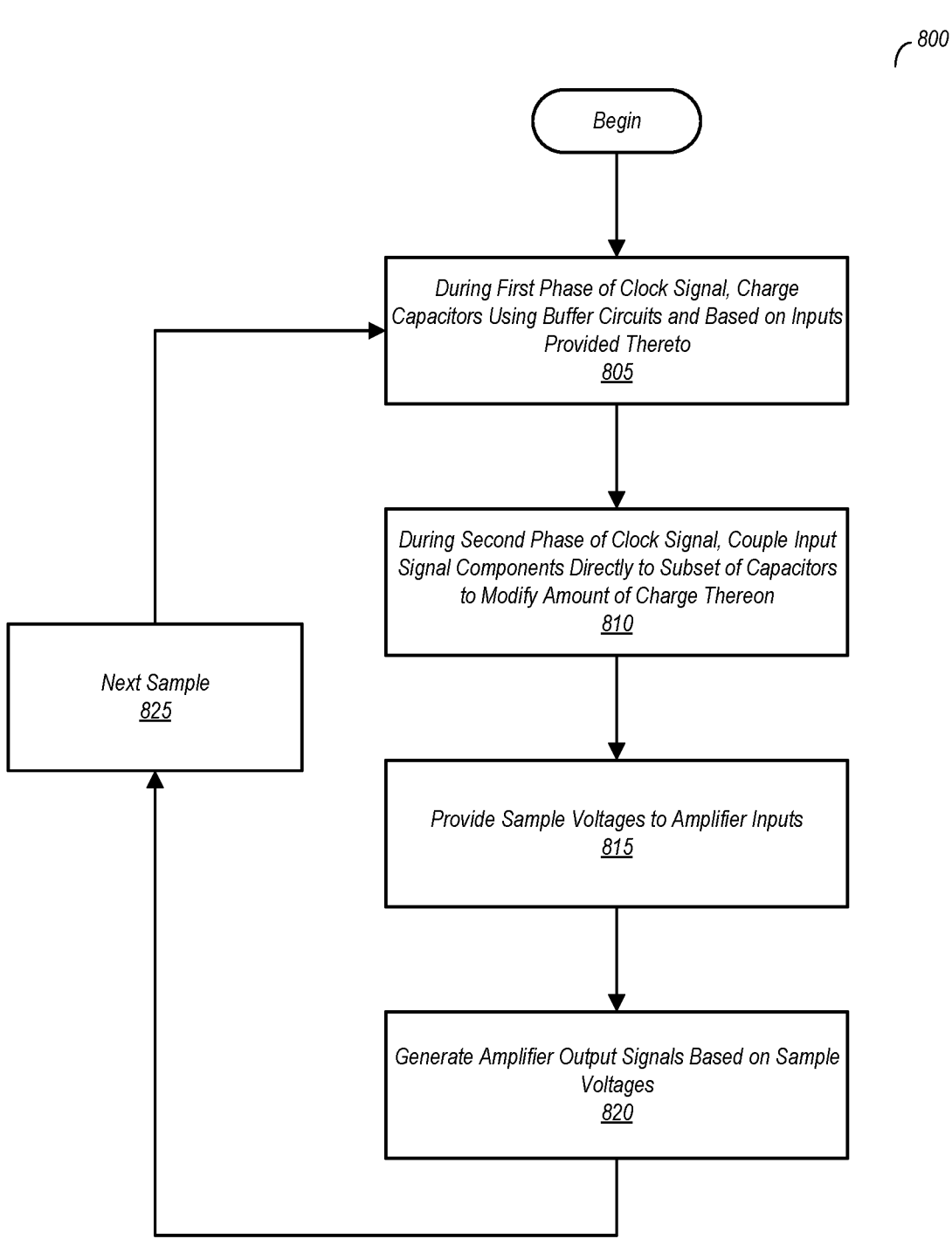
FIG. 8 is a flow diagram of another embodiment of a method for operating a switched capacitor amplifier.

FIG. 8 is a flow diagram of another embodiment of a method for operating a switched capacitor amplifier. Method 800 as disclosed herein may be applied to various ones of the switched capacitor amplifier embodiments discussed above. Embodiments of a switched capacitor amplifier not explicitly disclosed herein but otherwise capable of carrying out Method 800 are also considered to fall within the scope of this disclosure.

Method 800 includes, during a first phase of clock signal, charging capacitors using buffer circuits and based on inputs provided thereto (block 805). In an embodiment arranged for sampling differential signals, this may include two different buffers that are each arranged to receive one of the components of the differential signal. Each of the buffers may be arranged to charge at least two different capacitors. Embodiments in which a single-ended signals are received are also possible and contemplated, using a single buffer to charge at least two different capacitors. In both single-ended and differential embodiments, the amount of charging of the various capacitors is based both in the voltage of the input signal(s) and any error voltage introduced by the buffers.

During a second phase of the clock signal, input signal components may be coupled directly a subset of the capacitors to modify the amount of charge thereon (block 810). The amount of charge by which the capacitors of the subset are modified may be substantially equivalent in voltage terms to the error voltage that affected the charging of the capacitors in the first phase. Accordingly, with the input signals directly coupled to capacitors of the subset, their respective voltages may be equivalent to the voltage of the input signals.

Based on the amount of charge on the subset of capacitors, sample voltages are generated and provided to the inputs of an amplifier circuit (block 815). Based on these sample voltages, the amplifier generates an output signal (block 820). The output signal is a signal representative of the sample and may be either a differential signal or a single ended signal, depending on the particular arrangement of the circuit. Method 800 also returns to block 805 and repeats.

Figure 9:
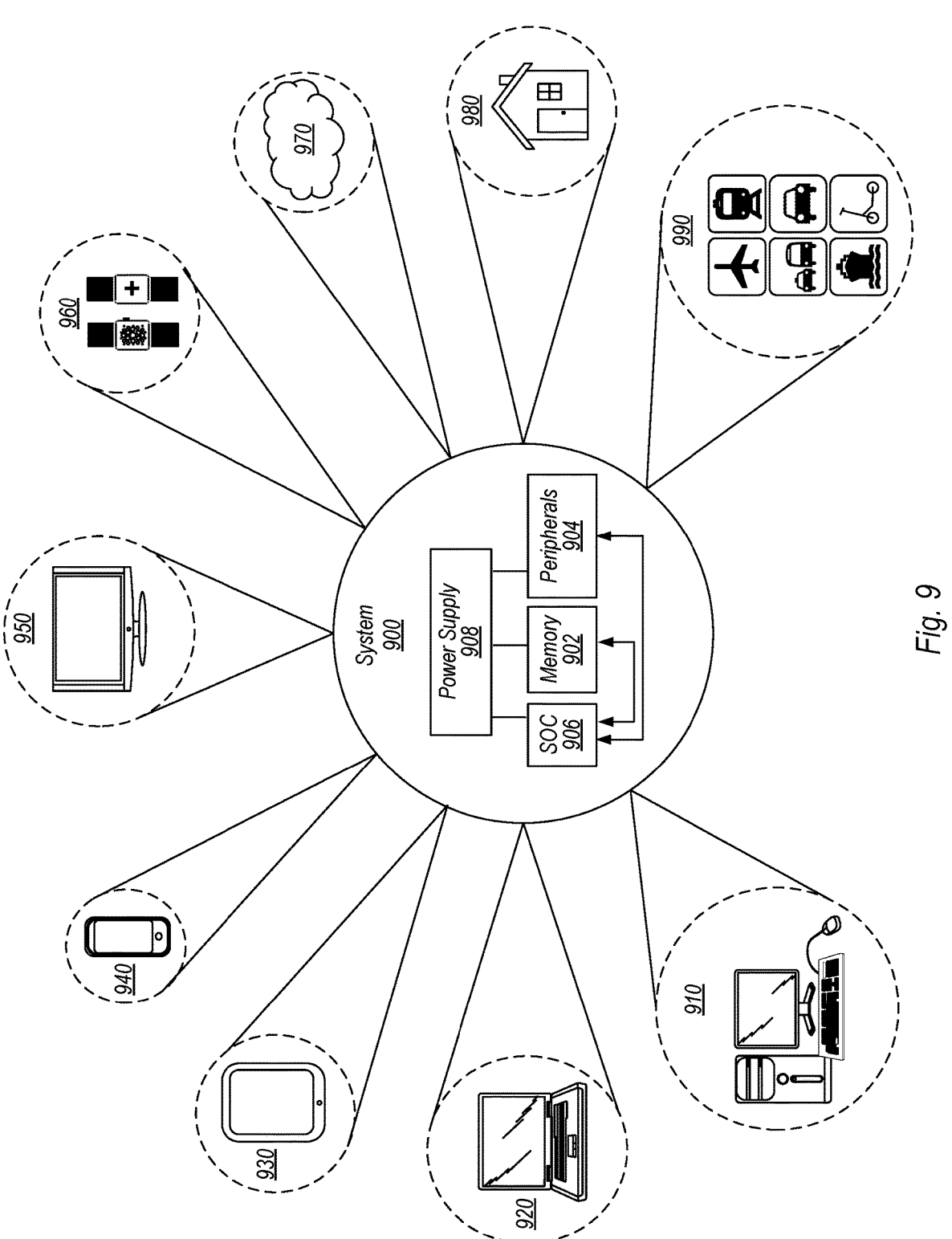
FIG. 9 is a block diagram of one embodiment of an example system.

Example System:

Turning next to FIG. 9, a block diagram of one embodiment of a system 900 is shown that may incorporate and/or otherwise utilize the methods and mechanisms described herein. In the illustrated embodiment, the system 900 includes at least one instance of a system on chip (SoC) 906 which may include multiple types of processing units, such as a central processing unit (CPU), a graphics processing unit (GPU), or otherwise, a communication fabric, and interfaces to memories and input/output devices. In some embodiments, one or more processors in SoC 906 includes multiple execution lanes and an instruction issue queue. In various embodiments, SoC 906 is coupled to external memory 902, peripherals 904, and power supply 908.

A power supply 908 is also provided which supplies the supply voltages to SoC 906 as well as one or more supply voltages to the memory 902 and/or the peripherals 904. In various embodiments, power supply 908 represents a battery (e.g., a rechargeable battery in a smart phone, laptop or tablet computer, or other device). In some embodiments, more than one instance of SoC 906 is included (and more than one external memory 902 is included as well).

The memory 902 is any type of memory, such as dynamic random access memory (DRAM), synchronous DRAM (SDRAM), double data rate (DDR, DDR2, DDR3, etc.) SDRAM (including mobile versions of the SDRAMs such as mDDR3, etc., and/or low power versions of the SDRAMs such as LPDDR2, etc.), RAMBUS DRAM (RDRAM), static RAM (SRAM), etc. One or more memory devices are coupled onto a circuit board to form memory modules such as single inline memory modules (SIMMs), dual inline memory modules (DIMMs), etc. Alternatively, the devices are mounted with a SoC or an integrated circuit in a chip-on-chip configuration, a package-on-package configuration, or a multi-chip module configuration.

SoC 906 may include circuitry having one or more switched capacitor amplifiers in accordance with the discussion above. Such switched capacitor amplifiers may be implemented as part of an, e.g., sigma-delta ADC or some other type of sampling circuitry. In addition, various other ICs within system 900, such as those implemented on peripherals 904, may also include implementations of the switched capacitor amplifiers discussed herein.

The peripherals 904 include any desired circuitry, depending on the type of system 900. For example, in one embodiment, peripherals 904 includes devices for various types of wireless communication, such as Wi-Fi, Bluetooth, cellular, global positioning system, etc. In some embodiments, the peripherals 904 also include additional storage, including RAM storage, solid state storage, or disk storage. The peripherals 904 include user interface devices such as a display screen, including touch display screens or multi-touch display screens, keyboard or other input devices, microphones, speakers, etc.

As illustrated, system 900 is shown to have application in a wide range of areas. For example, system 900 may be utilized as part of the chips, circuitry, components, etc., of a desktop computer 910, laptop computer 920, tablet computer 930, cellular or mobile phone 940, or television 950 (or set-top box coupled to a television). Also illustrated is a smartwatch and health monitoring device 960. In some embodiments, smartwatch 960 may include a variety of general-purpose computing related functions. For example, smartwatch 960 may provide access to email, cellphone service, a user calendar, and so on. In various embodiments, a health monitoring device may be a dedicated medical device or otherwise include dedicated health related functionality. For example, a health monitoring device may monitor a user's vital signs, track proximity of a user to other users for the purpose of epidemiological social distancing, contact tracing, provide communication to an emergency service in the event of a health crisis, and so on. In various embodiments, the above-mentioned smartwatch may or may not include some or any health monitoring related functions. Other wearable devices are contemplated as well, such as devices worn around the neck, devices that are implantable in the human body, glasses designed to provide an augmented and/or virtual reality experience, and so on.

System 900 may further be used as part of a cloud-based service(s) 970. For example, the previously mentioned devices, and/or other devices, may access computing resources in the cloud (i.e., remotely located hardware and/or software resources). Still further, system 900 may be utilized in one or more devices of a home other than those previously mentioned. For example, appliances within the home may monitor and detect conditions that warrant attention. For example, various devices within the home (e.g., a refrigerator, a cooling system, etc.) may monitor the status of the device and provide an alert to the homeowner (or, for example, a repair facility) should a particular event be detected. Alternatively, a thermostat may monitor the temperature in the home and may automate adjustments to a heating/cooling system based on a history of responses to various conditions by the homeowner. Also illustrated in FIG. 9 is the application of system 900 to various modes of transportation. For example, system 900 may be used in the control and/or entertainment systems of aircraft, trains, buses, cars for hire, private automobiles, waterborne vessels from private boats to cruise liners, scooters (for rent or owned), and so on. In various cases, system 900 may be used to provide automated guidance (e.g., self-driving vehicles), general systems control, and otherwise. These any many other embodiments are possible and are contemplated. It is noted that the devices and applications illustrated in FIG. 9 are illustrative only and are not intended to be limiting. Other devices are possible and are contemplated.

It is noted that while the circuits discussed above have been implemented using NMOS and PMOS transistors, the disclosure is not intended to limit embodiments falling within its scope to these types of devices. Thus, in addition to various MOSFET types discussed above, the present disclosure also contemplates embodiments that use non-planar devices such as FinFETs, GAAFETs (Gate All Around FETs), among other types. Embodiments implemented using Bipolar devices are also possible and contemplated. The disclosure further contemplates that technologies that are speculative as of this writing may be used to implement devices in various embodiments of the circuits discussed herein. These technologies include (but are not limited to) graphene transistors, carbon nanotube transistors, gallium arsenide transistors, and so on. The use of memristors in certain circuit structures is also contemplated.

The present disclosure includes references to "an "embodiment" or groups of "embodiments" (e.g., "some embodiments" or "various embodiments"). Embodiments are different implementations or instances of the disclosed concepts. References to "an embodiment," "one embodiment," "a particular embodiment," and the like do not necessarily refer to the same embodiment. A large number of possible embodiments are contemplated, including those specifically disclosed, as well as modifications or alternatives that fall within the spirit or scope of the disclosure.

This disclosure may discuss potential advantages that may arise from the disclosed embodiments. Not all implementations of these embodiments will necessarily manifest any or all of the potential advantages. Whether an advantage is realized for a particular implementation depends on many factors, some of which are outside the scope of this disclosure. In fact, there are a number of reasons why an implementation that falls within the scope of the claims might not exhibit some or all of any disclosed advantages. For example, a particular implementation might include other circuitry outside the scope of the disclosure that, in conjunction with one of the disclosed embodiments, negates or diminishes one or more the disclosed advantages. Furthermore, suboptimal design execution of a particular implementation (e.g., implementation techniques or tools) could also negate or diminish disclosed advantages. Even assuming a skilled implementation, realization of advantages may still depend upon other factors such as the environmental circumstances in which the implementation is deployed. For example, inputs supplied to a particular implementation may prevent one or more problems addressed in this disclosure from arising on a particular occasion, with the result that the benefit of its solution may not be realized. Given the existence of possible factors external to this disclosure, it is expressly intended that any potential advantages described herein are not to be construed as claim limitations that must be met to demonstrate infringement. Rather, identification of such potential advantages is intended to illustrate the type(s) of improvement available to designers having the benefit of this disclosure. That such advantages are described permissively (e.g., stating that a particular advantage "may arise") is not intended to convey doubt about whether such advantages can in fact be realized, but rather to recognize the technical reality that realization of such advantages often depends on additional factors.

Unless stated otherwise, embodiments are non-limiting. That is, the disclosed embodiments are not intended to limit the scope of claims that are drafted based on this disclosure, even where only a single example is described with respect to a particular feature. The disclosed embodiments are intended to be illustrative rather than restrictive, absent any statements in the disclosure to the contrary. The application is thus intended to permit claims covering disclosed embodiments, as well as such alternatives, modifications, and equivalents that would be apparent to a person skilled in the art having the benefit of this disclosure.

For example, features in this application may be combined in any suitable manner. Accordingly, new claims may be formulated during prosecution of this application (or an application claiming priority thereto) to any such combination of features. In particular, with reference to the appended claims, features from dependent claims may be combined with those of other dependent claims where appropriate, including claims that depend from other independent claims. Similarly, features from respective independent claims may be combined where appropriate.

Accordingly, while the appended dependent claims may be drafted such that each depends on a single other claim, additional dependencies are also contemplated. Any combinations of features in the dependent claims that are consistent with this disclosure are contemplated and may be claimed in this or another application. In short, combinations are not limited to those specifically enumerated in the appended claims.

Where appropriate, it is also contemplated that claims drafted in one format or statutory type (e.g., apparatus) are intended to support corresponding claims of another format or statutory type (e.g., method).

Because this disclosure is a legal document, various terms and phrases may be subject to administrative and judicial interpretation. Public notice is hereby given that the following paragraphs, as well as definitions provided throughout the disclosure, are to be used in determining how to interpret claims that are drafted based on this disclosure.

References to a singular form of an item (i.e., a noun or noun phrase preceded by "a," "an," or "the") are, unless context clearly dictates otherwise, intended to mean "one or more." Reference to "an item" in a claim thus does not, without accompanying context, preclude additional instances of the item. A "plurality" of items refers to a set of two or more of the items.

The word "may" is used herein in a permissive sense (i.e., having the potential to, being able to) and not in a mandatory sense (i.e., must).

The terms "comprising" and "including," and forms thereof, are open-ended and mean "including, but not limited to."

When the term "or" is used in this disclosure with respect to a list of options, it will generally be understood to be used in the inclusive sense unless the context provides otherwise. Thus, a recitation of "x or y" is equivalent to "x or y, or both," and thus covers 1) x but not y, 2) y but not x, and 3) both x and y. On the other hand, a phrase such as "either x or y, but not both" makes clear that "or" is being used in the exclusive sense.

A recitation of "w, x, y, or z, or any combination thereof" or "at least one of . . . w, x, y, and z" is intended to cover all possibilities involving a single element up to the total number of elements in the set. For example, given the set [w, x, y, z], these phrasings cover any single element of the set (e.g., w but not x, y, or z), any two elements (e.g., w and x, but not y or z), any three elements (e.g., w, x, and y, but not z), and all four elements. The phrase "at least one of . . . w, x, y, and z" thus refers to at least one element of the set [w, x, y, z], thereby covering all possible combinations in this list of elements. This phrase is not to be interpreted to require that there is at least one instance of w, at least one instance of x, at least one instance of y, and at least one instance of z.

Various "labels" may precede nouns or noun phrases in this disclosure. Unless context provides otherwise, different labels used for a feature (e.g., "first circuit," "second circuit," "particular circuit," "given circuit," etc.) refer to different instances of the feature. Additionally, the labels "first," "second," and "third" when applied to a feature do not imply any type of ordering (e.g., spatial, temporal, logical, etc.), unless stated otherwise.

The phrase "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

The phrases "in response to" and "responsive to" describe one or more factors that trigger an effect. This phrase does not foreclose the possibility that additional factors may affect or otherwise trigger the effect, either jointly with the specified factors or independent from the specified factors. That is, an effect may be solely in response to those factors, or may be in response to the specified factors as well as other, unspecified factors. Consider the phrase "perform A in response to B." This phrase specifies that B is a factor that triggers the performance of A, or that triggers a particular result for A. This phrase does not foreclose that performing A may also be in response to some other factor, such as C. This phrase also does not foreclose that performing A may be jointly in response to B and C. This phrase is also intended to cover an embodiment in which A is performed solely in response to B. As used herein, the phrase "responsive to" is synonymous with the phrase "responsive at least in part to." Similarly, the phrase "in response to" is synonymous with the phrase "at least in part in response to."

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical). More specifically, this formulation is used to indicate that this structure is arranged to perform the one or more tasks during operation. A structure can be said to be "configured to" perform some tasks even if the structure is not currently being operated. Thus, an entity described or recited as being "configured to" perform some tasks refers to something physical, such as a device, circuit, a system having a processor unit and a memory storing program instructions executable to implement the task, etc. This phrase is not used herein to refer to something intangible.

In some cases, various units/circuits/components may be described herein as performing a set of tasks or operations. It is understood that those entities are "configured to" perform those tasks/operations, even if not specifically noted.

The term "configured to" is not intended to mean "configurable to." An unprogrammed FPGA, for example, would not be considered to be "configured to" perform a particular function. This unprogrammed FPGA may be "configurable to" perform that function, however. After appropriate programming, the FPGA may then be said to be "configured to" perform the particular function.

For purposes of U.S. patent applications based on this disclosure, reciting in a claim that a structure is "configured to" perform one or more tasks is expressly intended not to invoke 35 U.S.C. § 112 (f) for that claim element. Should Applicant wish to invoke Section 112(f) during prosecution of a U.S. patent application based on this disclosure, it will recite claim elements using the "means for" [performing a function] construct.

Different "circuits" may be described in this disclosure. These circuits or "circuitry" constitute hardware that includes various types of circuit elements, such as combinatorial logic, clocked storage devices (e.g., flip-flops, registers, latches, etc.), finite state machines, memory (e.g., random-access memory, embedded dynamic random-access memory), programmable logic arrays, and so on. Circuitry may be custom designed, or taken from standard libraries. In various implementations, circuitry can, as appropriate, include digital components, analog components, or a combination of both. Certain types of circuits may be commonly referred to as "units" (e.g., a decode unit, an arithmetic logic unit (ALU), functional unit, memory management unit (MMU), etc.). Such units also refer to circuits or circuitry.

The disclosed circuits/units/components and other elements illustrated in the drawings and described herein thus include hardware elements such as those described in the preceding paragraph. In many instances, the internal arrangement of hardware elements within a particular circuit may be specified by describing the function of that circuit. For example, a particular "decode unit" may be described as performing the function of "processing an opcode of an instruction and routing that instruction to one or more of a plurality of functional units," which means that the decode unit is "configured to" perform this function. This specification of function is sufficient, to those skilled in the computer arts, to connote a set of possible structures for the circuit.

In various embodiments, as discussed in the preceding paragraph, circuits, units, and other elements may be defined by the functions or operations that they are configured to implement. The arrangement and such circuits/units/components with respect to each other and the manner in which they interact form a microarchitectural definition of the hardware that is ultimately manufactured in an integrated circuit or programmed into an FPGA to form a physical implementation of the microarchitectural definition. Thus, the microarchitectural definition is recognized by those of skill in the art as structure from which many physical implementations may be derived, all of which fall into the broader structure described by the microarchitectural definition. That is, a skilled artisan presented with the microarchitectural definition supplied in accordance with this disclosure may, without undue experimentation and with the application of ordinary skill, implement the structure by coding the description of the circuits/units/components in a hardware description language (HDL) such as Verilog or VHDL. The HDL description is often expressed in a fashion that may appear to be functional. But to those of skill in the art in this field, this HDL description is the manner that is used to transform the structure of a circuit, unit, or component to the next level of implementational detail. Such an HDL description may take the form of behavioral code (which is typically not synthesizable), register transfer language (RTL) code (which, in contrast to behavioral code, is typically synthesizable), or structural code (e.g., a netlist specifying logic gates and their connectivity). The HDL description may subsequently be synthesized against a library of cells designed for a given integrated circuit fabrication technology, and may be modified for timing, power, and other reasons to result in a final design database that is transmitted to a foundry to generate masks and ultimately produce the integrated circuit. Some hardware circuits or portions thereof may also be custom-designed in a schematic editor and captured into the integrated circuit design along with synthesized circuitry. The integrated circuits may include transistors and other circuit elements (e.g. passive elements such as capacitors, resistors, inductors, etc.) and interconnect between the transistors and circuit elements. Some embodiments may implement multiple integrated circuits coupled together to implement the hardware circuits, and/or discrete elements may be used in some embodiments. Alternatively, the HDL design may be synthesized to a programmable logic array such as a field programmable gate array (FPGA) and may be implemented in the FPGA. This decoupling between the design of a group of circuits and the subsequent low-level implementation of these circuits commonly results in the scenario in which the circuit or logic designer never specifies a particular set of structures for the low-level implementation beyond a description of what the circuit is configured to do, as this process is performed at a different stage of the circuit implementation process.

The fact that many different low-level combinations of circuit elements may be used to implement the same specification of a circuit results in a large number of equivalent structures for that circuit. As noted, these low-level circuit implementations may vary according to changes in the fabrication technology, the foundry selected to manufacture the integrated circuit, the library of cells provided for a particular project, etc. In many cases, the choices made by different design tools or methodologies to produce these different implementations may be arbitrary.

Moreover, it is common for a single implementation of a particular functional specification of a circuit to include, for a given embodiment, a large number of devices (e.g., millions of transistors). Accordingly, the sheer volume of this information makes it impractical to provide a full recitation of the low-level structure used to implement a single embodiment, let alone the vast array of equivalent possible implementations. For this reason, the present disclosure describes structure of circuits using the functional shorthand commonly employed in the industry.

Numerous variations and modifications will become apparent to those skilled in the art once the above disclosure is fully appreciated. It is intended that the following claims be interpreted to embrace all such variations and modifications.

What is claimed is:

1. An apparatus, comprising:
   a first buffer circuit configured, during a first time period, to charge a first set of capacitors based on a voltage level of a first polarity of a differentially encoded input signal;
   a second buffer circuit configured, during the first time period, to charge a second set of capacitors based on a voltage level of a second polarity of the differentially encoded input signal;
   a switch circuit configured to:
      modify, during a second time period, a first amount of charge stored in a first capacitor of the first set of capacitors;
      modify, during the second time period, a second amount of charge stored in a first capacitor of the second set of capacitors; and
      generate first and second sample voltages using respective voltages across the first and second sets of capacitors;
      wherein to modify the first and second amounts of charge, the switch circuit is further configured to couple ones of the first set of capacitors and ones of the second set of capacitors to a ground node; and
   an amplifier circuit configured to generate an output signal using the first and second sample voltages.

2. The apparatus of claim 1, wherein, to modify the first and second amounts of charge during the second time period, the switch circuit is configured to:
   couple a first component of the differentially encoded input signal directly to the first capacitor of the first set of capacitors; and
   couple a second component of the differentially encoded input signal directly to the first capacitor of the second set of capacitors.

3. The apparatus of claim 1, wherein, to charge the first and second sets of capacitors during the first time period, the switch circuit is configured to:

couple an output of the first buffer circuit to the first capacitor of the first set of capacitors and a second capacitor of the first set of capacitors; and couple an output of the second buffer circuit to the first capacitor of the second set of capacitors and a second capacitor of the second set of capacitors.

4. The apparatus of claim 3, wherein, during the first time period, the switch circuit is configured to:

couple a first component of the differentially encoded input signal exclusively to an input of the first buffer circuit; and couple a second component of the differentially encoded input signal exclusively to an input of the second buffer circuit.

5. The apparatus of claim 1, wherein the switch circuit is configured to, during the second time period, create a short circuit between a second capacitor of the first set of capacitors and a second capacitor of the second set of capacitors.

6. The apparatus of claim 5, wherein to create the short circuit between the second capacitor of the first set of capacitors and the second capacitor of the second set of capacitors, the switch circuit is further configured to couple a non-grounded terminal of the second capacitor of the first set of capacitors to a non-grounded terminal of the second capacitor of the second set of capacitors.

7. The apparatus of claim 1, further comprising:

a first offset cancellation circuit coupled to a non-inverting input of the first buffer circuit, wherein the first offset cancellation circuit is configured to sample an offset voltage of the first buffer circuit during the second time period and to cause adjustment of an amount of charge applied to the first set of capacitors during a subsequent first time period; and a second offset cancellation circuit coupled to a non-inverting input of the second buffer circuit, wherein the second offset cancellation circuit is configured to sample an offset voltage of the second buffer circuit during the second time period and to cause adjustment of an amount of charge applied to the second set of capacitors during a subsequent first time period.

8. The apparatus of claim 1, further comprising:

a first common mode cancellation circuit configured to cancel a common mode voltage from the first sample voltage; and a second common mode cancellation circuit configured to cancel the common mode voltage from the second sample voltage.

9. The apparatus of claim 1, further comprising:

a loop filter configured to generate a filtered output signal using the output signal from the amplifier circuit;

a comparator coupled configured to generate a comparison signal using the filtered output signal;

a first digital-to-analog converter (DAC) configured to generate a first analog signal based on the comparison signal, wherein the first DAC is coupled to provide the first analog signal to a non-inverting input of the amplifier circuit; and a second DAC configured to generate a second analog signal based on the comparison signal, wherein the second DAC is coupled to provide the second analog signal to an inverting input of the amplifier circuit.

10. The apparatus of claim 1, wherein the first time period is a first phase of a clock signal having two phases, and wherein the second time period is a second phase of the clock signal.

11. A method, comprising:

charging, during a first time period, by a plurality of buffer circuits based on respective input voltages of a plurality of input voltages, a corresponding plurality of sampling capacitors;

modifying, during a second time period, respective amounts of charge stored in the plurality of sampling capacitors using the plurality of input voltages;

combining respective charges for at least a subset of the plurality of sampling capacitors to generate a plurality of sample voltages, wherein the combining includes coupling, during the second time period via a switching circuit, a terminal of a particular sampling capacitor of the subset to a terminal of a different sampling capacitor of the subset, wherein the particular sampling capacitor and the different sampling capacitor are charged based on different input voltages of the plurality of input voltages; and amplifying, by an amplifier circuit, the plurality of sample voltages to generate an output signal.

12. The method of claim 11, wherein the plurality of input voltages comprise first and second components of a differential input signal, and wherein modifying respective amounts of charge stored in the plurality of sampling capacitors includes:

coupling a first component of the differential input signal directly to a first one of the plurality of sampling capacitors; and coupling a second component of the differential input signal directly to a second one of the plurality of sampling capacitors.

13. The method of claim 11, further comprising:

providing a first component of a differential input signal to a first buffer circuit of the plurality of buffer circuits;

charging, using the first buffer circuit and based on the first component of the differential input signal, a first subset of the plurality of sampling capacitors;

providing a second component of the differential input signal to a second buffer circuit of the plurality of buffer circuits; and charging, using the second buffer circuit and based on the second component of the differential input signal, a second subset of the plurality of sampling capacitors.

14. The method of claim 13, further comprising coupling ones of the plurality of sampling capacitors to a ground node during the second time period.

15. The method of claim 11, wherein the first time period is a first phase of a clock signal having two phases, and wherein the second time period is a second phase of the clock signal.

16. A system comprising:

a sampling circuit, wherein the sampling circuit includes:

a first buffer circuit configured to, based on an input signal, charge a first plurality of capacitors during a first time period; and a switch circuit configured to, during a second time period, cause a modification of an amount of charge stored on a first one of the first plurality of capacitors, wherein causing the modification of the amount of charge comprises the switch circuit coupling the input signal directly to the first one of the first plurality of capacitors;

a common mode cancellation circuit configured to cancel a common mode voltage from a signal generated by the first buffer circuit; and an amplifier circuit configured to generate an output signal using sampling voltages based on respective amounts of charge present on ones of the first plurality of capacitors.

17. The system of claim 16, wherein the input signal is a differential signal, and wherein the sampling circuit further includes a second buffer circuit configured to charge a second plurality of capacitors during the first time period, wherein the first buffer circuit is configured to charge the first plurality of capacitors based on a true component of the differential signal, and wherein the second buffer circuit is configured to charge the second plurality of capacitors based on a complementary component of the differential signal.

18. The system of claim 17, wherein the switch circuit is configured to:

couple the true component of the differential signal exclusively to an input of the first buffer circuit during the first time period; and couple the complementary component of the differential signal exclusively to an input of the second buffer circuit during the first time period.

19. The system of claim 17, further comprising:

a filter coupled between an output of the amplifier circuit and an input of comparison circuit, wherein the filter is configured to generate a filtered version of the output signal, and further comprising a comparator circuit configured to generate a digital signal based on the filtered version of the output signal;

a first digital-to-analog converter (DAC) circuit configured to modify a sample voltage provided to a true input of the amplifier circuit, based on the digital signal; and a second DAC circuit configured to modify a sample voltage provided to a complementary circuit of the amplifier circuit, based on the digital signal.

20. The system of claim 16, wherein to cause the modification of the amount of charge stored on the first capacitor, the switch circuit is further configured to:

couple a first terminal of the first capacitor to the input signal; and couple a second terminal of the first capacitor to a ground node.

* * * * *